(12) United States Patent
Dao et al.

(10) Patent No.: US 9,553,460 B2
(45) Date of Patent: *Jan. 24, 2017

(54) WIRELESS BATTERY MANAGEMENT SYSTEM

(71) Applicant: Elite Power Solutions LLC, Chandler, AZ (US)

(72) Inventors: Yuan Dao, Phoenix, AZ (US); William Jeffrey Schlanger, Flagstaff, AZ (US)

(73) Assignee: Elite Power Solutions LLC, Chandler, AZ (US)

( * ) Notice: Subject to any disclaimer, the term of this patent is extended or adjusted under 35 U.S.C. 154(b) by 123 days.

This patent is subject to a terminal disclaimer.

(21) Appl. No.: 14/657,248

(22) Filed: Mar. 13, 2015

(65) Prior Publication Data

US 2015/0188334 A1     Jul. 2, 2015

Related U.S. Application Data

(63) Continuation-in-part of application No. 13/077,136, filed on Mar. 31, 2011, now Pat. No. 9,000,935.

(51) Int. Cl.
| | |
|---|---|
| *H02J 7/00* | (2006.01) |
| *H04Q 9/00* | (2006.01) |
| *G01R 31/36* | (2006.01) |
| *H01M 10/48* | (2006.01) |
| *H01M 10/42* | (2006.01) |

(52) U.S. Cl.
CPC ............ *H02J 7/0013* (2013.01); *H02J 7/0052* (2013.01); *H04Q 9/00* (2013.01); *G01R 31/3658* (2013.01); *G01R 31/3689* (2013.01); *H01M 10/486* (2013.01); *H01M 2010/4271* (2013.01); *H04Q 2209/10* (2013.01); *H04Q 2209/30* (2013.01); *H04Q 2209/823* (2013.01); *H04Q 2213/1308* (2013.01)

(58) Field of Classification Search
CPC ..................................................... Y02E 60/12
USPC ........................................................ 320/107
See application file for complete search history.

(56) References Cited

U.S. PATENT DOCUMENTS

| | | | |
|---|---|---|---|
| 6,060,864 A * | 5/2000 | Ito ..................... | G01R 19/16542 320/134 |
| 6,377,028 B1 * | 4/2002 | Armstrong, II ....... | H02J 7/0047 320/136 |
| 6,406,806 B1 | 6/2002 | Keshula et al. | |
| 7,932,702 B1 | 4/2011 | Patino et al. | |

(Continued)

*Primary Examiner* — Yalkew Fantu
(74) *Attorney, Agent, or Firm* — Invention To Patent Services; Alex Hobson

(57) ABSTRACT

A wireless battery management system includes a computing device and first and second battery unit monitoring modules. The computing device includes an output data request port and an input data port. In response to a data request from the output data request port of the computing device, a first battery unit monitoring module transmits data of the first battery unit to the input data port of the computing device wirelessly and may transmits a data request to the second battery unit monitoring module. In response, the second battery unit monitoring module may transmit data of the second battery unit to the input data port of the computing device wirelessly or transmit data of the second battery to the first module for wireless transmission. In addition, each battery unit monitoring module may communicate wirelessly and independently with the computing device.

19 Claims, 23 Drawing Sheets

(56) References Cited

U.S. PATENT DOCUMENTS

| | | |
|---|---|---|
| 8,219,333 B2 | 7/2012 | Li |
| 8,258,747 B2 | 9/2012 | Andres et al. |
| 8,350,519 B2 | 1/2013 | Brantner et al. |
| 8,350,529 B2 | 1/2013 | Loncarevic |
| 8,872,474 B2 | 10/2014 | Scheucher |
| 9,000,935 B2 * | 4/2015 | Dao .................. H04Q 9/00 320/107 |
| 2004/0249534 A1 | 12/2004 | Yamada et al. |
| 2007/0176604 A1 | 8/2007 | Morimoto |
| 2009/0115252 A1 * | 5/2009 | Caraghiorghiopol ..... H02J 1/10 307/48 |
| 2010/0097033 A1 * | 4/2010 | Tange .................. H02J 7/0026 320/116 |
| 2011/0140650 A1 | 6/2011 | Zhang et al. |
| 2011/0234231 A1 | 9/2011 | Liu et al. |
| 2011/0236731 A1 * | 9/2011 | Bell .................... H01M 2/1077 429/50 |
| 2011/0279087 A1 | 11/2011 | Andres et al. |
| 2012/0116628 A1 | 5/2012 | Clark et al. |
| 2012/0319658 A1 | 12/2012 | White et al. |
| 2014/0312848 A1 | 10/2014 | Alexander et al. |

* cited by examiner

`US 9,553,460 B2`

WIRELESS BATTERY MANAGEMENT SYSTEM

This application is a continuation in part of U.S. patent application Ser. No. 13/077,136, filed on Mar. 31, 2011, entitled Battery Management System and currently pending; the entirety of which is incorporated by reference herein.

BACKGROUND OF THE INVENTION

Field of the Invention

The present invention relates to battery management systems that measure and monitor data of batteries in a battery pack, and specifically to battery management systems that transmit battery data wirelessly to a computing device.

Background

Current battery management systems obtain data about individual batteries in a battery unit. The systems reserve addresses for communication with battery unit sensors and/or battery units. When sensors transmit data about battery units to the management system, the sensors include the address of the battery unit. Such a system may require significant amounts or resources and complex arrangements for connecting the components of the system. Additionally, current systems for battery management may require complex, expensive systems for detecting potentially hazardous connections between battery units and their enclosure, such as a chassis in an electric vehicle.

As shown in FIG. 19, lithium batteries have a non-linear discharge profile, with a relatively flat discharge region up to about 80% discharged. Therefore, a small change in voltage can mean a large difference in the state of charge, unlike a lead acid battery that has a relatively linear drop in voltage as the battery is discharged. The state of charge of a lead acid battery, and therefore the amount of power remaining, is more easily monitored by simply measuring the voltage of the lead acid battery. The amount of power remaining in a lithium battery system is more difficult to monitor and predict however by simply measuring voltage. It would therefore be more difficult to determine the available power remaining in a lithium battery unit by simply measuring the voltage.

The wiring of battery management systems with a computing device can be expensive and complicated. The large number of wires may be difficult to route from a battery pack to a computing device. In addition, when a battery has to be changed out, keeping track of the wires and the correct location for installation of a new battery can be very difficult.

SUMMARY OF THE INVENTION

A battery management system may include battery unit monitoring modules for obtaining data about battery units in a battery pack. A battery pack may comprise one or more batter units and each battery unit may comprise two or more individual batteries. A computing device can obtain the data by sending a data request to a first battery monitoring module. The first monitoring module obtains and transmits data about its connected battery to the computing device and sends a data request to the second monitoring module. The second monitoring module obtains and transmits data about its connected battery to the computing device and sends a data request to the next monitoring module. Each successive monitoring module performs the same steps until all the monitoring modules have sent data about their connected battery units to the computing device. Thus, the computing device needs solely a data request port and input data port(s) to obtain the data for a battery pack.

In one aspect, the present disclosure describes a battery management system. The battery management system includes a computing device with an output data request port and an input data port. The battery management system also includes first and second battery unit monitoring modules, each battery unit monitoring module connected to the input data port of the computing device. In response to a data request from the output data request port of the computing device, the first battery unit monitoring module transmits data of the first battery unit to the input data port of the computing device, and transmits a data request to the second battery unit monitoring module. In response to the data request from the first battery unit monitoring module, the second battery unit monitoring module transmits data of the second battery unit to the input data port of the computing device.

The first battery unit monitoring module can connect to a first battery unit in a battery pack of an electric vehicle. The battery management system can also include wiring connecting the computing device to the battery unit monitoring modules. Because the battery units in a battery pack can be wired in series, the physical locations of the positive and negative terminals arranged in an alternating fashion, the second battery unit monitoring module is oriented in an opposite direction from the first battery unit monitoring module.

The first battery unit monitoring module can include an analog-to-digital converter. The analog-to-digital converter can measure a voltage of the first battery unit. The first battery unit monitoring module can include a temperature monitoring device that measures a temperature of the first battery unit. The temperature can be expressed as a voltage which is applied to an input of the analog-to-digital converter. Data of the first battery unit can be a voltage and a temperature of the first battery unit. Data of the second battery unit can be a voltage and a temperature of the second battery unit.

The computing device can scan the first and second battery unit monitoring modules to determine a number of battery unit monitoring modules in the battery management system. The computing device can transmit a second data request to the first battery unit monitoring module after the computing device has not received data on the input data port for a predetermined period of time. The predetermined period of time may be 20 ms. The computing device can include an analog-to-digital convertor that measures a voltage across the first and second battery units. The computing device can include an analog-to-digital convertor that measures a current flowing in the first and second battery units.

The computing device can output an alarm when an error condition is detected. The error condition can be a high voltage condition, a low voltage condition, as high current condition, a high temperature condition, or a connection fault condition. The computing device can shut of a battery charger when the computing device detects a high voltage condition across the first and second battery units. The computing device can shut off a motor controller when the computing device detects a low voltage condition across the first and second battery units.

The battery management system can include a monitor, such as a video monitor, that displays the data of the first and second battery units. The battery management system can include a connection fault detector that detects a connection between a node at a zero voltage reference level and the first and second battery units. The battery management system can include one or more battery unit balancing systems, each system balancing charge in a battery unit.

In another aspect, the present disclosure describes a battery management system with a computing device and first and second battery unit monitoring modules. The computing device includes a first output data request or and an input data port. The first battery unit monitoring module includes a first input data request port connected to the output data request port of the controller, a first output data port connected to the input data port of the controller, and a second output data request port. The second battery unit monitoring module includes a second input data request port connected to the second output data request port of the first battery unit monitoring module, and a second output data port connected to the input data port of the controller.

A physical cable may be coupled between the battery monitoring module and the battery data input for the transfer of data and requests. In an alternative embodiment, a wireless transmitter may transmit a request for data or send data, and a wireless receiver may be configured for receipt of this information. For example, as wireless transmitter may be coupled with the computing device and may send a request for data to a battery monitoring module. A wireless receiver coupled with battery monitoring module may receive this request and may then send data about the first battery, the battery unit or the battery pack, to the a receiver coupled with the battery data input through a wireless transmitter. A wireless signal receiver may be coupled with the battery data input to provide battery data to the computing device. Any suitable configuration of wireless receivers and transmitters may be used to reduce the number of physical connections between a battery pack and a power control system. A wireless battery monitoring module is described in U.S. patent application Ser. No. 14/225,251, to Dr. Yuan Dao, et al, and entitled Uninterrupted Lithium Battery Power Supply System; the entirety of which is incorporated by reference herein.

In one embodiment, a single wireless transmitter is configured on a battery unit to send battery data about each battery within the battery unit. In another embodiment, a single wireless transmitter is configured to send data about each battery within as battery pack. Since the battery data request signal is sent from battery to battery in a relay communication method, a single wireless receiver may only be required to receive the input data request from a wireless signal sent by a computer wireless signal transmitter. In this configuration, only a single address is required for each battery unit, or for the entire pack, thereby reducing the possibility of interference with other wireless signal devices.

For the purposes of illustration, an exemplary battery unit comprises four lithium batteries, each having a battery monitoring module coupled thereto and module connectors linking each battery in series together for data transmission. A wireless module signal receiver is configured on the first battery of the battery unit and receives a wireless input data request signal from a wireless computer signal transmitter coupled with the computer output data request port. The first battery then sends data wirelessly through a wireless module signal transmitter that is received by a wireless computer signal receiver coupled with the input data port of the computing device by a serial data line. The first battery then sends a data request signal to the input data request port of the second battery monitoring module in the battery unit through a module connector. The second battery unit monitoring module then transmits second battery data to the wireless module signal transmitter through the module connector. The wireless module signal transmitter then sends second battery data wirelessly to the input data port of the computer. The second battery then sends a data request signal to the input data port of the third battery and again the third battery send third battery data through module connectors to the wireless module signal transmitter for transmission to the input data port of the computer. Finally, the third battery then sends a data request signal to the input data port of the fourth battery and again the fourth battery send fourth battery data through module connectors to the wireless module signal transmitter for transmission to the input data port of the computer. In this example, all of the individual battery data is received by the computer or computing device with only a single data request signal. It is be understood that a module connector may couple a first battery unit with subsequent battery units to continue the relay method described to all batteries in a battery pack.

In another embodiment, each battery monitoring module is configured with a wireless module signal receiver and a wireless module signal transmitter. In this embodiment, the computing device is attached to a wireless computer signal receiver and a wireless computer signal transmitter. The computing device sends a data request pulse to the wireless computer signal transmitter which sends a data request command via a wireless signal to the wireless module signal receiver of the first wireless battery unit monitoring module. The data request command includes the address of the first wireless battery unit monitoring module, in this case address number 1, for example. The first wireless battery unit monitoring module transmits a response consisting of first battery voltage and/or temperature data by a wireless module signal transmitter, which is received by the wireless computer signal receiver coupled with the computing device. This first battery voltage and/or temperature data is collected by the receiver and conveyed to the computing device via a serial data line. As soon as this data is received by the computing device, the computing device sends the next wireless data request command with the second wireless battery unit monitoring module address, such as 2. Again, the second wireless battery unit monitoring module responds by sending a wireless signal, via a wireless module signal transmitter, having the second battery voltage and/or temperature information. The wireless computer signal receiver receives the second battery data and conveys it to the computing device via the serial data line. This process is repeated as many times as necessary to collect data from all the wireless battery unit monitoring modules. Once the receiver has collected all the data from all the wireless battery unit monitoring modules, the computing device will let a predetermined amount of time elapse and then it will send another data request pulse. This predetermined amount of time may be 20 ms, 30 ms, 50 ms or any length as needed If power is removed from the computing device, as may be the case when the application is an electric vehicle with the key turned to the off position, it will cease sending request pulses for data. In turn, the receiver will stop sending data request commands to the battery unit monitoring modules. Since the battery unit monitoring modules are powered from the battery units they are monitoring, it may be desirable to conserve power when the battery unit is not being used. To accomplish this, the battery unit monitoring module may shut down after 10 seconds of the last data request command. The battery unit monitoring modules may turn back on periodically, such as once per second, to see if the receiver has begun sending data request commands again. If so, the battery unit monitoring modules will remain powered up to process the request for data commands as long as these commands are sent.

Situations may arise where there will be multiple systems consisting of computing devices, receivers and battery unit monitoring modules located in close proximity. To avoid potential miscommunications in these systems several measures may be employed. There are many frequencies, such as 256, where the data requests and data responses may be transmitted. These frequencies may be chosen as part of the factory set up or as a subset of a system ID number. For example, the system ID number could be 24 bits of which 8 bits could be used for the frequency selection. The remaining 16 bits of the system ID number could be transmitted to the battery unit monitoring modules that would then only respond to commands containing the system ID for which it is programmed to respond.

A battery management system may be coupled to the battery monitoring modules for obtaining data about the batteries in a battery pack or battery unit. A computing device may obtain the battery data by sending a data request to the first monitoring module. The first monitoring module obtains and transmits data about its connected battery to the computing device and sends a data request to the second monitoring module. The second monitoring module obtains and transmits data about its connected battery to the computing device and sends a data request to the next monitoring module. Each successive monitoring module performs the same steps, in a relay method from one battery monitoring module to the next, until all the monitoring modules have sent data about their respective battery to the computing device. Therefore, the computing only is required to send a single a data request signal to obtain the data for an entire battery unit or battery pack. A module connector may be couple from one battery unit to a second battery unit, for example.

In an exemplary embodiment, a first battery monitoring module is configured to, in response to a data request from the computing device, transmit data of a first lithium battery to a battery data input. Subsequently, the first battery monitoring module transmits a data request to a second battery monitoring module through a module connector. The second battery monitoring module is configured to, in response to the data request from the first battery monitoring module, transmit data of said second lithium battery to the battery data input of the computing device. This process may be repeated for a third and any subsequent batteries in a battery pack. Thereby, data about each battery unit including voltage and temperature for example, is provided to the computing device in a very efficient manner. A battery data input may be coupled to a battery monitoring module through a cable or wirelessly. A battery data input may comprise a wireless signal receiver that is configured to receive a wireless signal having battery unit parameter data. A wireless signal generator may be coupled with a battery monitoring module. Likewise a data request output may comprise a wireless signal generator that is received by a wireless signal receiver of a battery monitoring module.

In an exemplary embodiment, the computing device is configured to transmit a second data request to the battery monitoring module coupled to the first lithium battery, after the computing device has not received a data input through the battery data input for a predetermined period of time. A second data request may be initiated after a preset amount of time of not receiving any data input, such as a fraction of a second.

A battery management system, as described herein, comprises a battery data input coupled with said battery monitoring modules, and computing device coupled with a data request output, and the data input. In an exemplary embodiment, a battery management system comprises a charging circuit coupled with the batteries or battery units to provide a charging current from said AC power input when a voltage of one of said batteries or battery units drops below a threshold value. A threshold value may be input during instillation by an operator of the system or at the manufacturer prior to delivery and may be stored by the computing device. A threshold value may be 3.2V or more, 3.3V or more, 3.4V or more, 3.5V or more and any value between and including the threshold values provided.

In another aspect, the present disclosure describes a method of managing a battery. The method includes transmitting, by a computing device, a first data request to a first battery unit monitoring module. The method also includes transmitting, by the first battery unit monitoring module, data of a first battery unit to an input data port of the computing device in response to the first data request. The method also includes transmitting, by the first battery unit monitoring module, a second data request to a second battery unit monitoring module. The method also includes transmitting, by the second battery unit monitoring module, data of a second battery unit to the input data port of the computing device in response to the second data request.

BRIEF DESCRIPTION OF THE DRAWINGS

The accompanying drawings are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
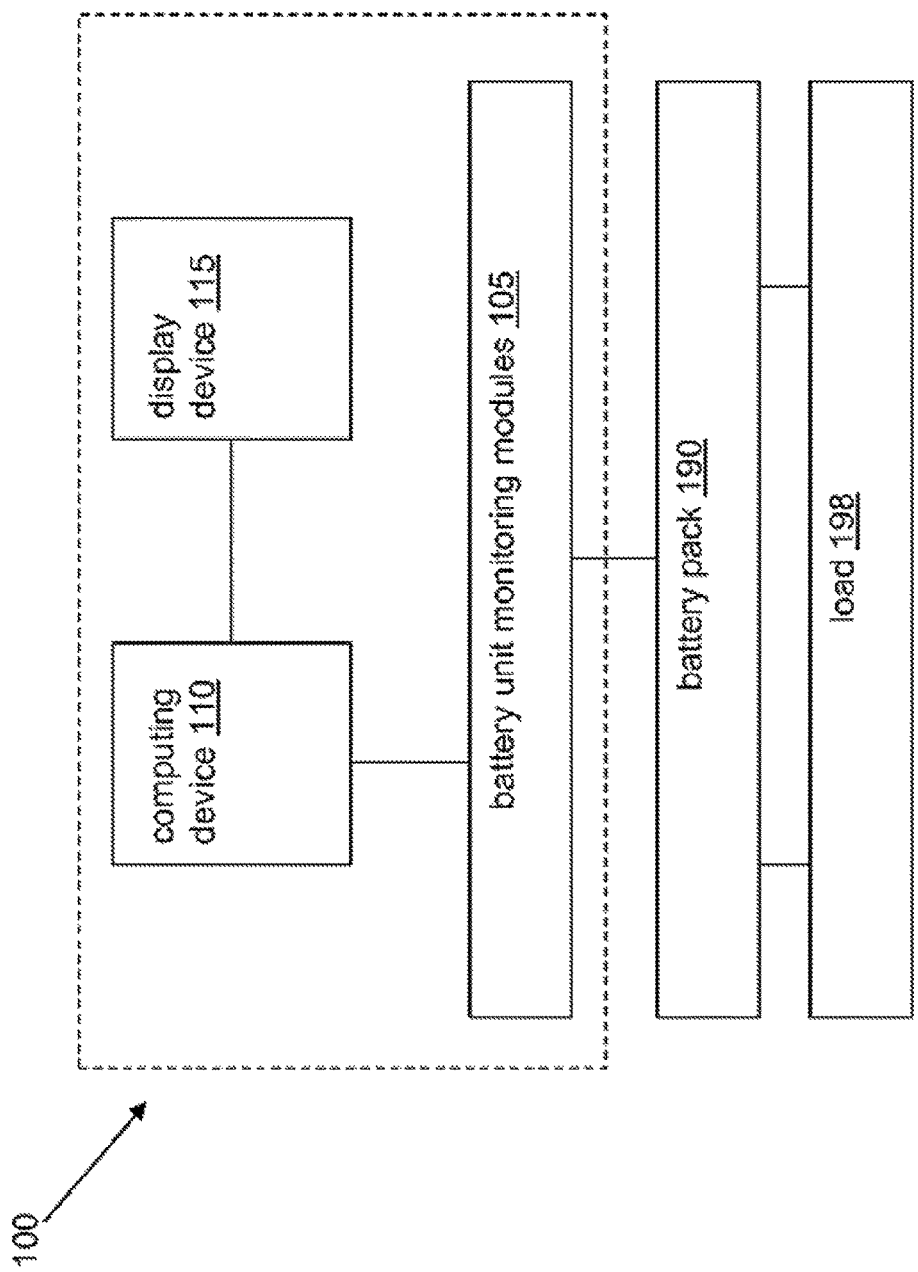
Figure 2:
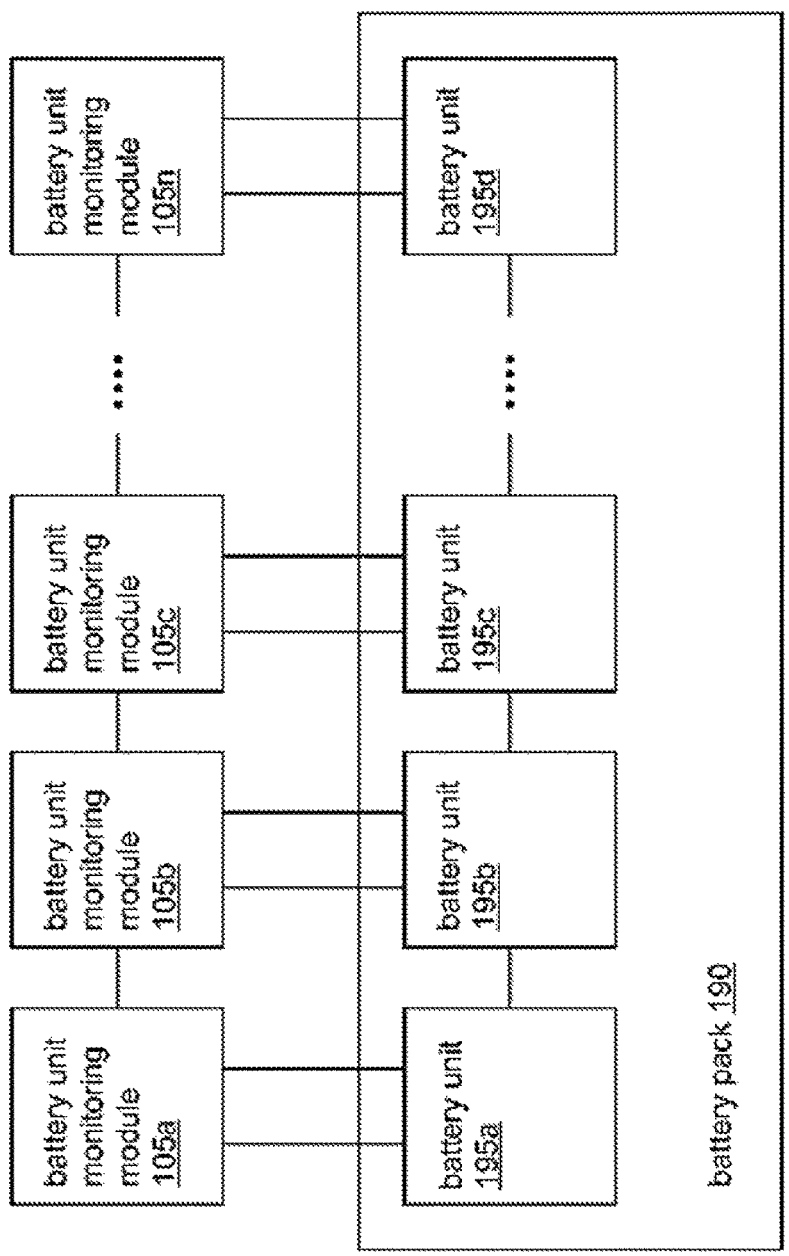
Figure 3:
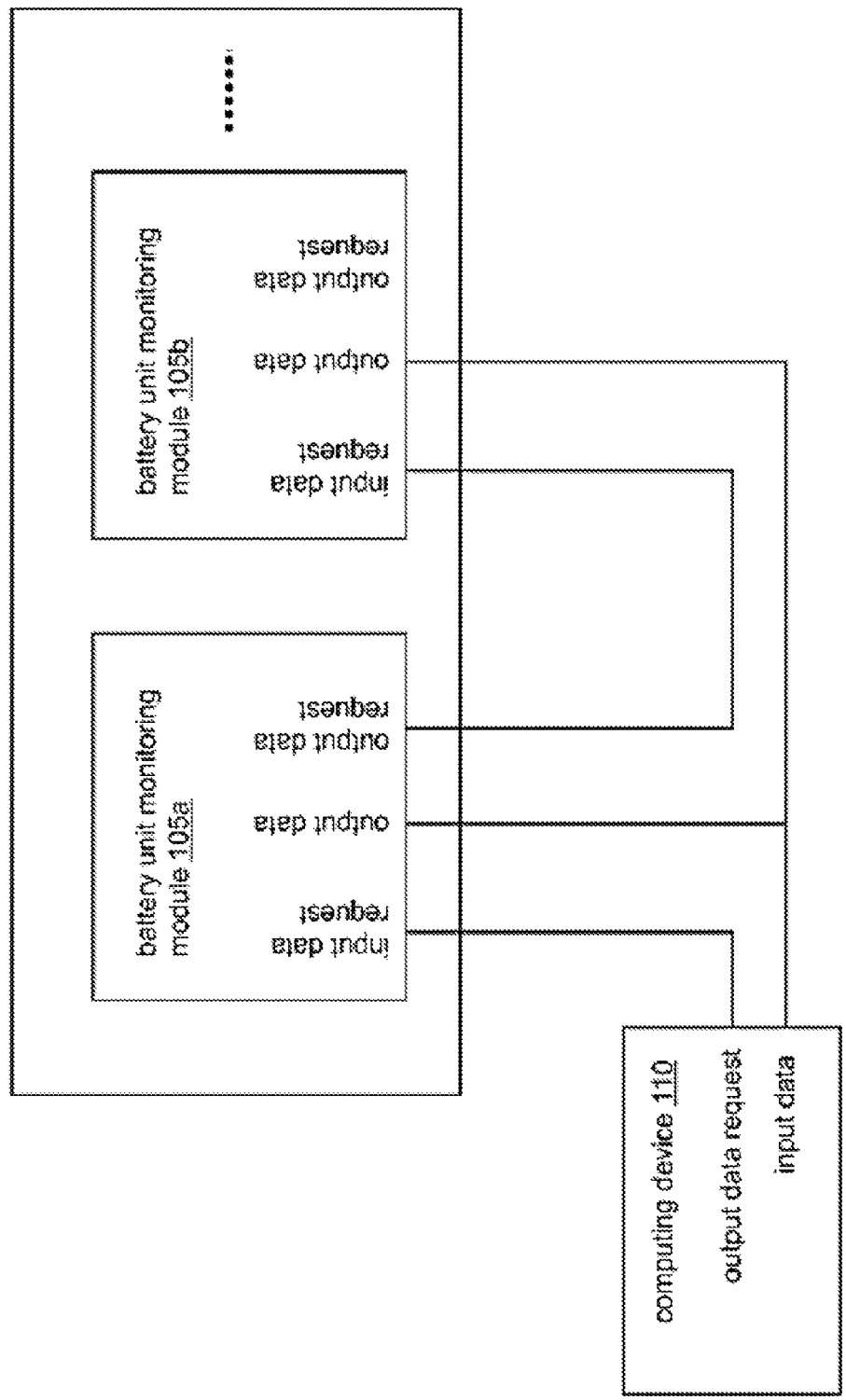
Figure 4:
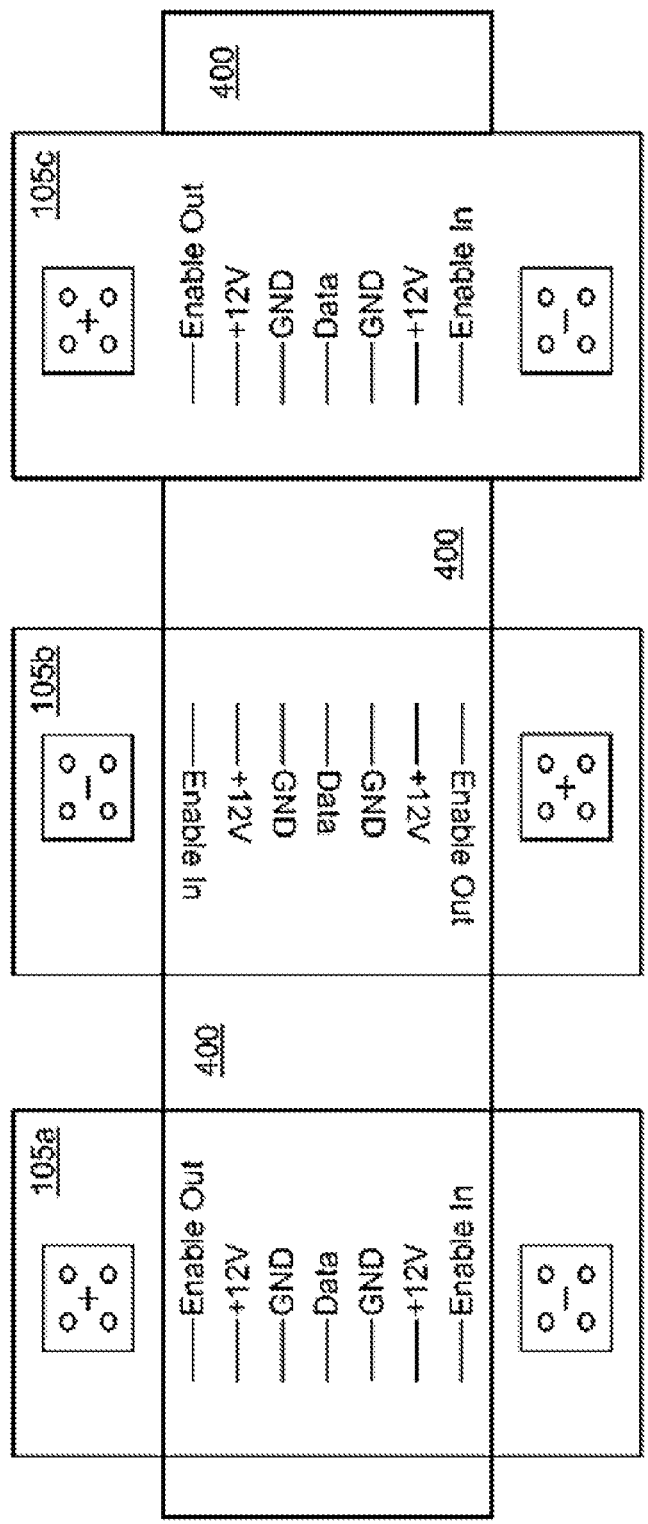
Figure 5:
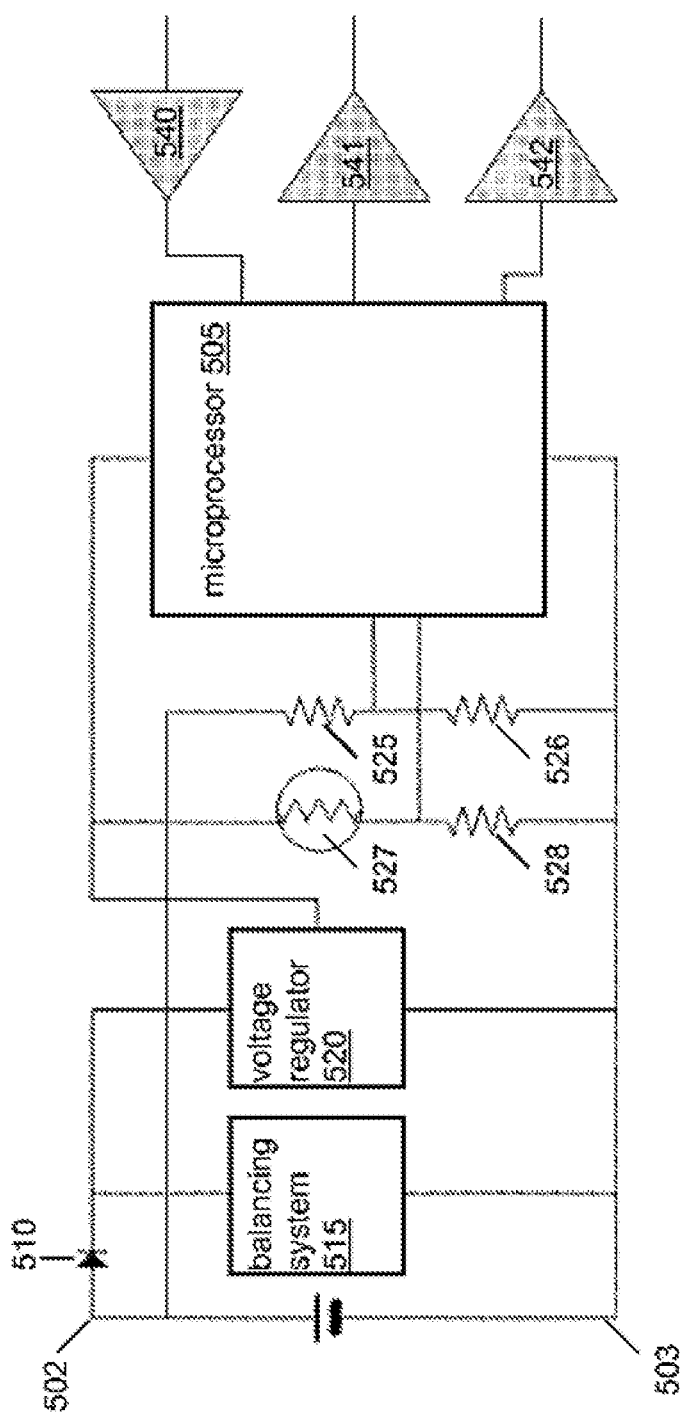
Figure 6:
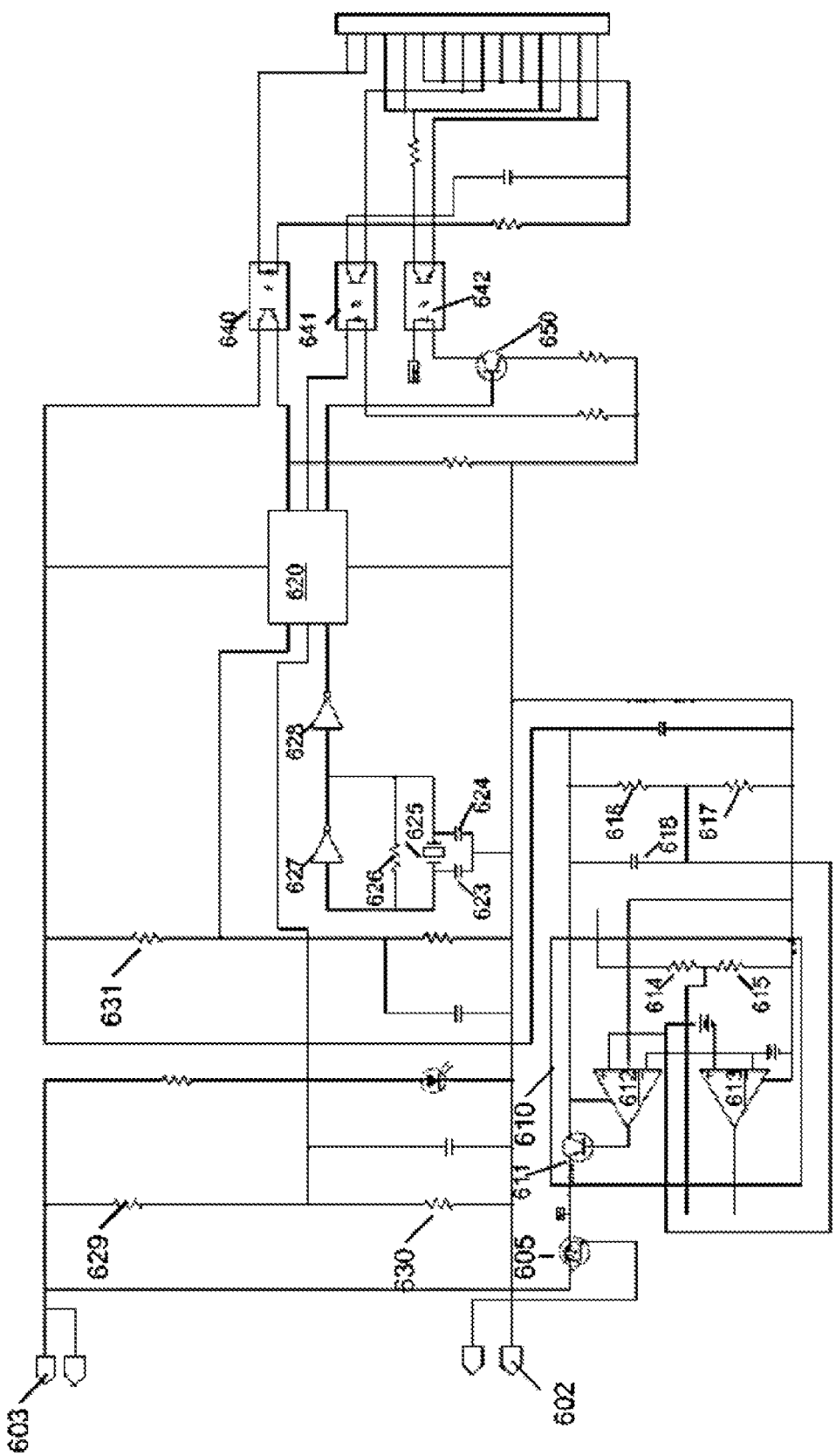
Figure 7:
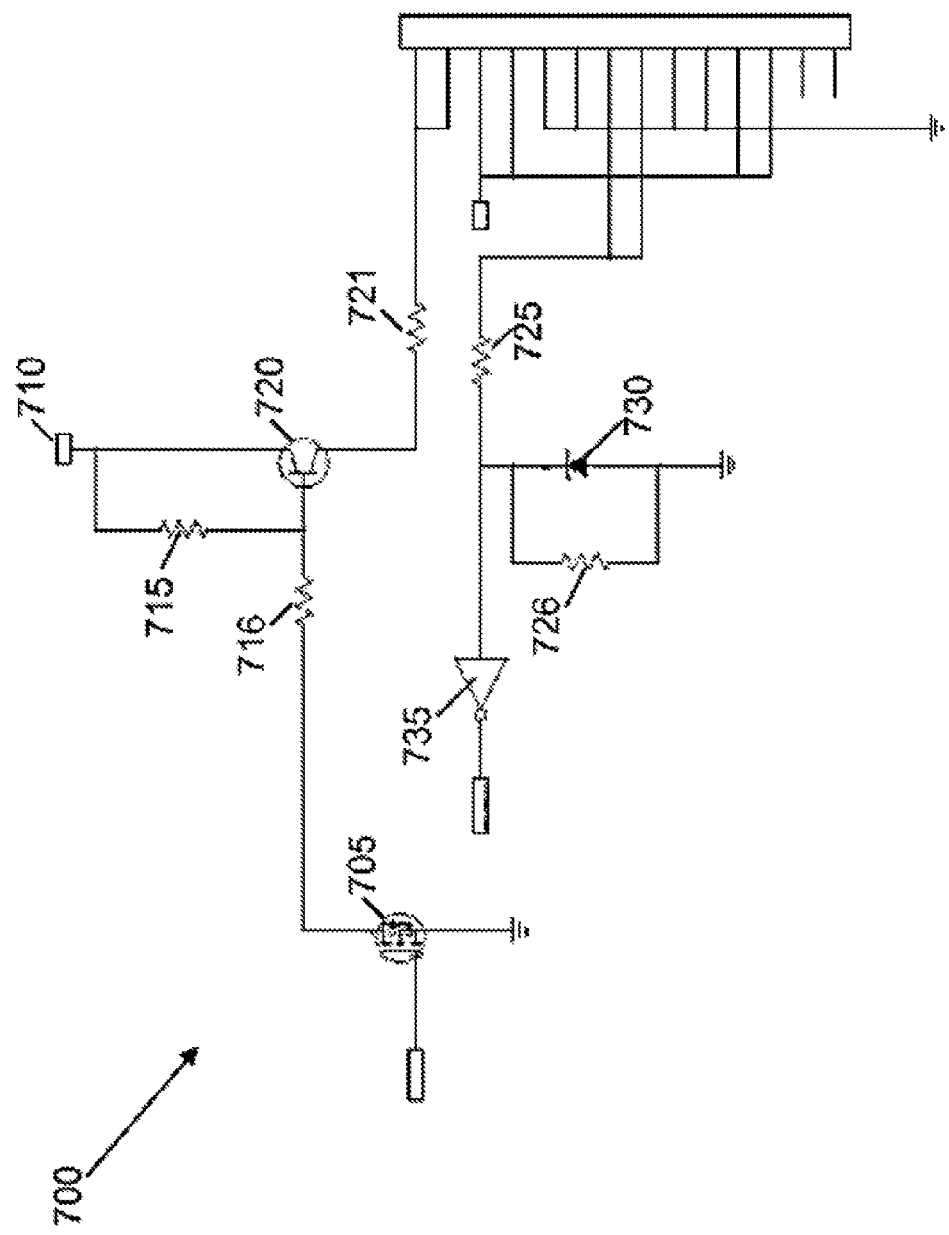
Figure 8:
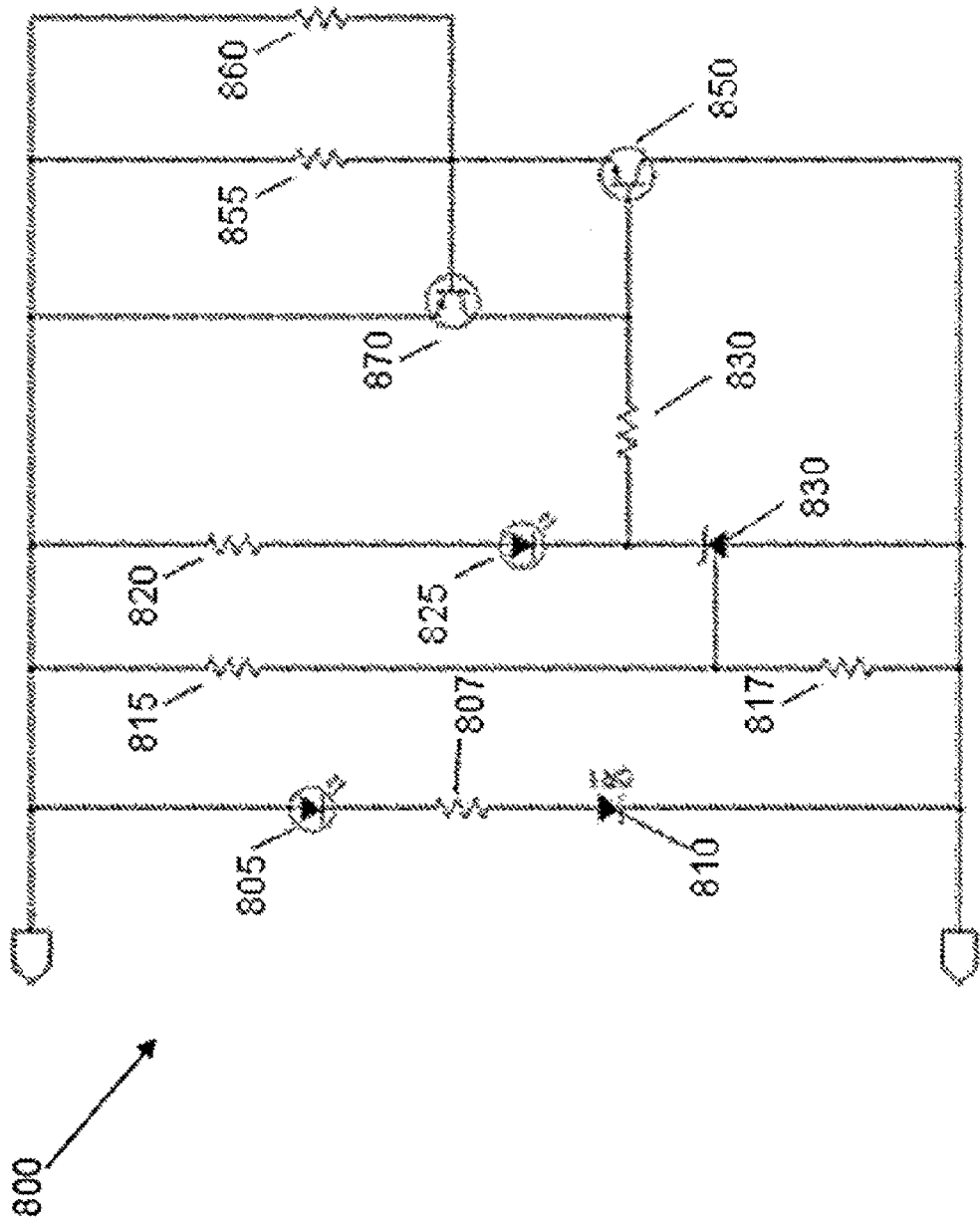
Figure 9:
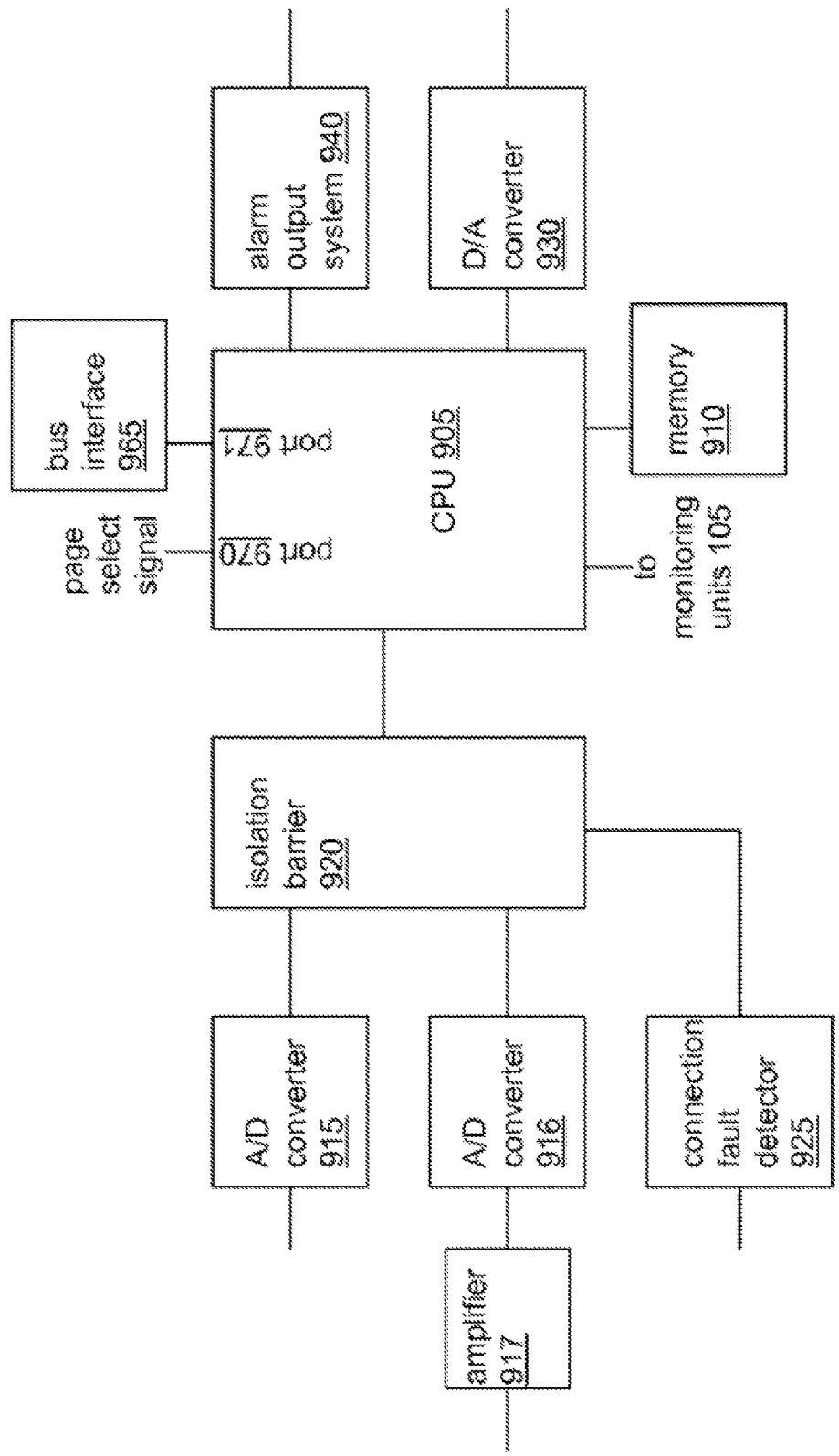
Figure 10:
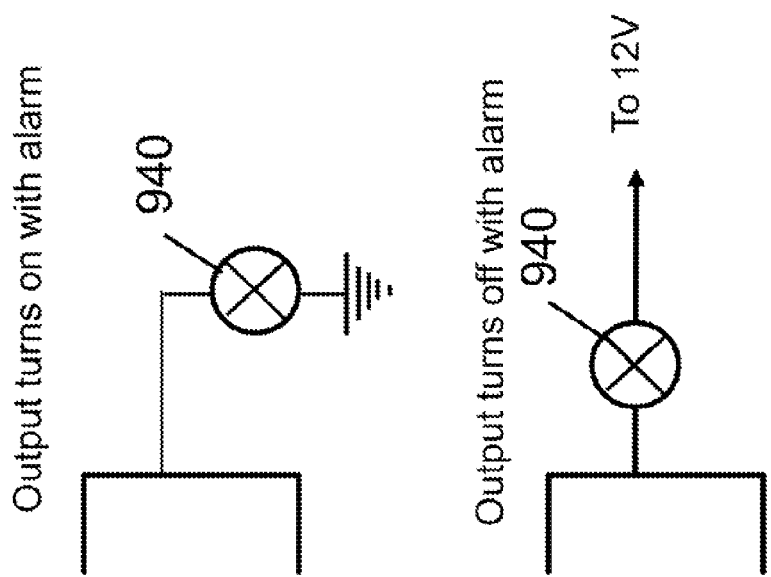
Figure 11:
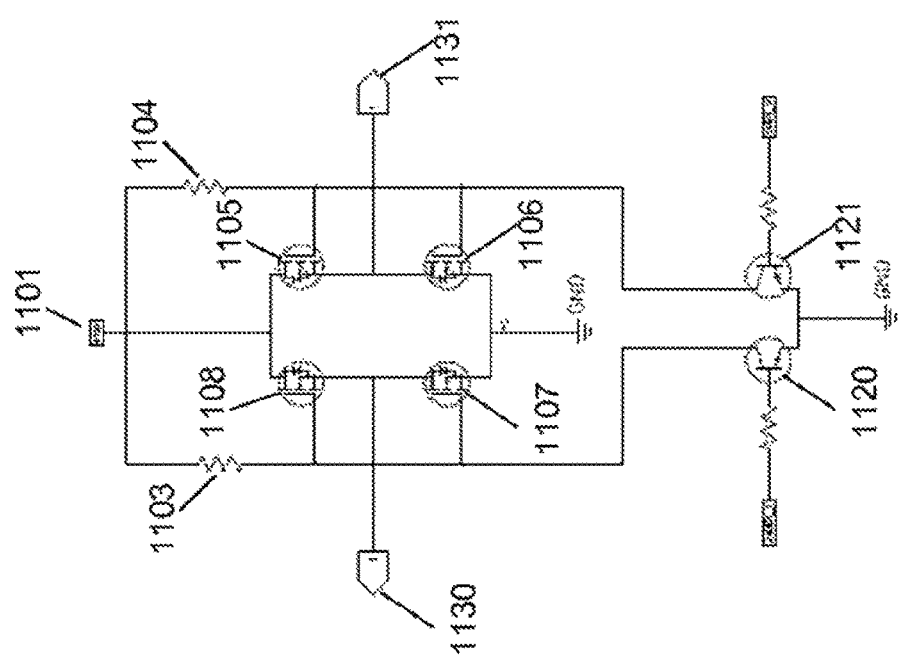
Figure 12:
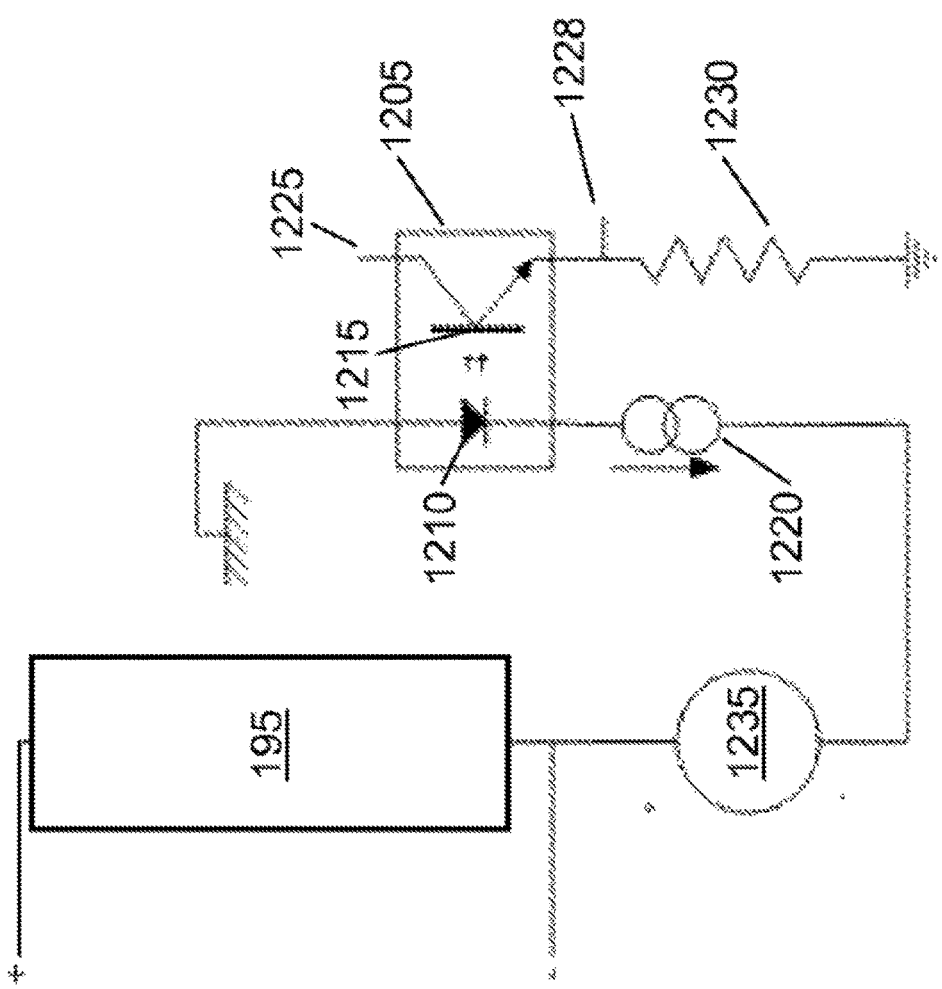
Figure 13:
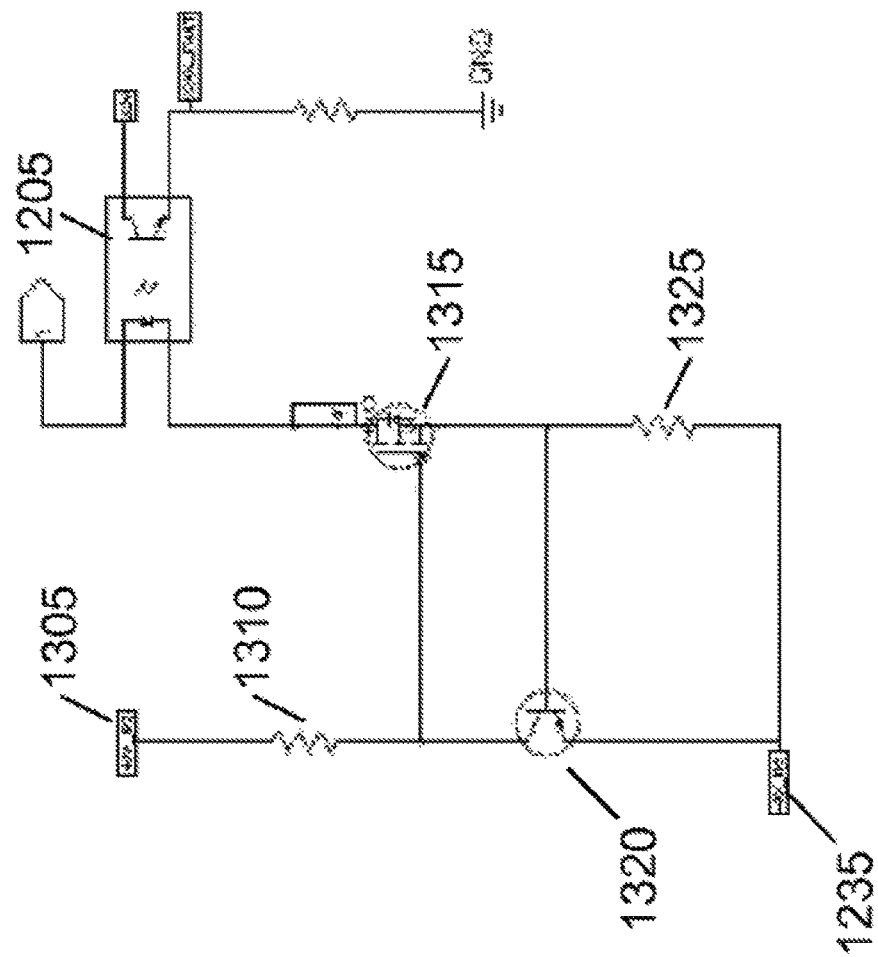
Figure 14:
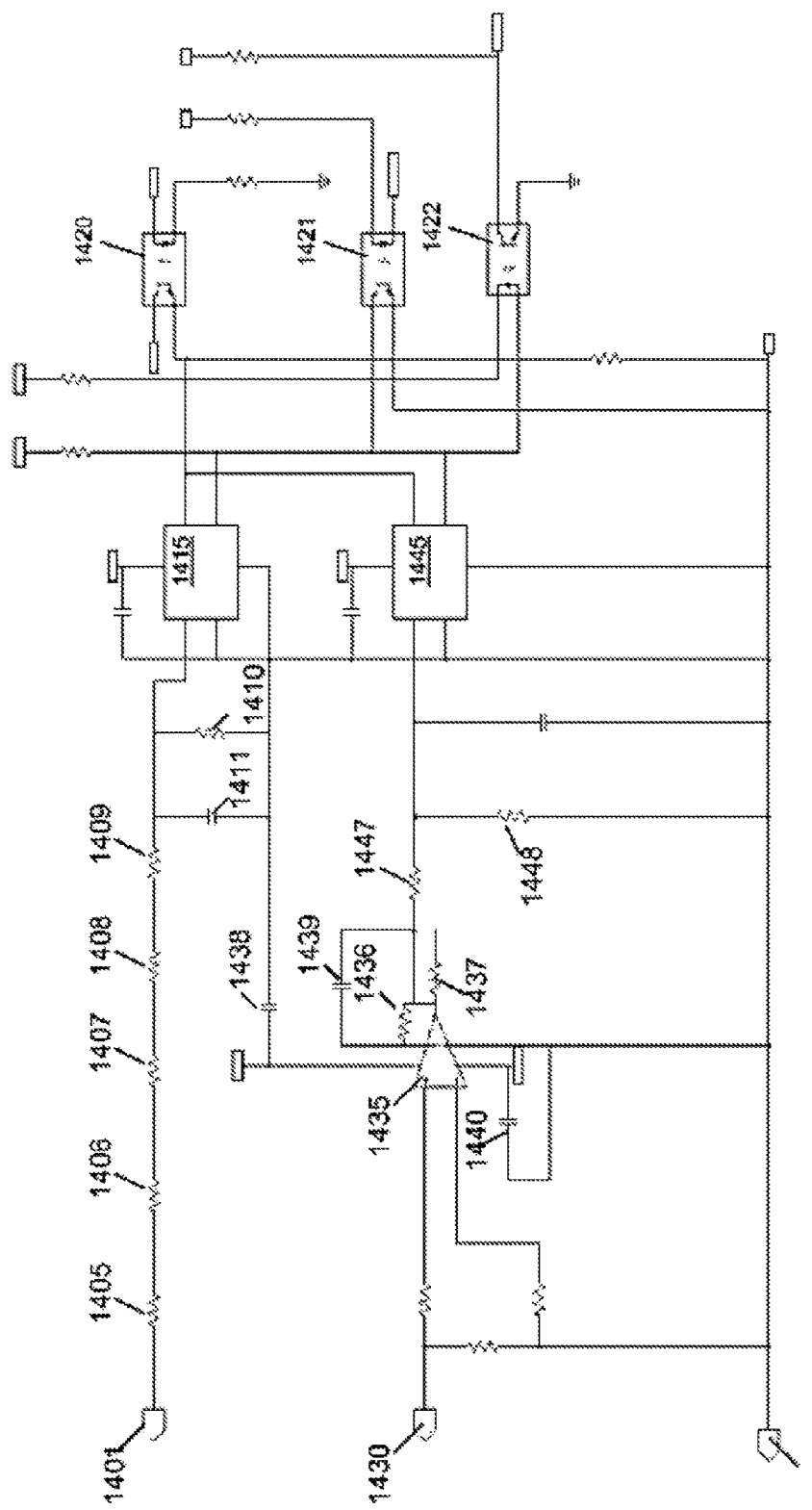
Figure 15:
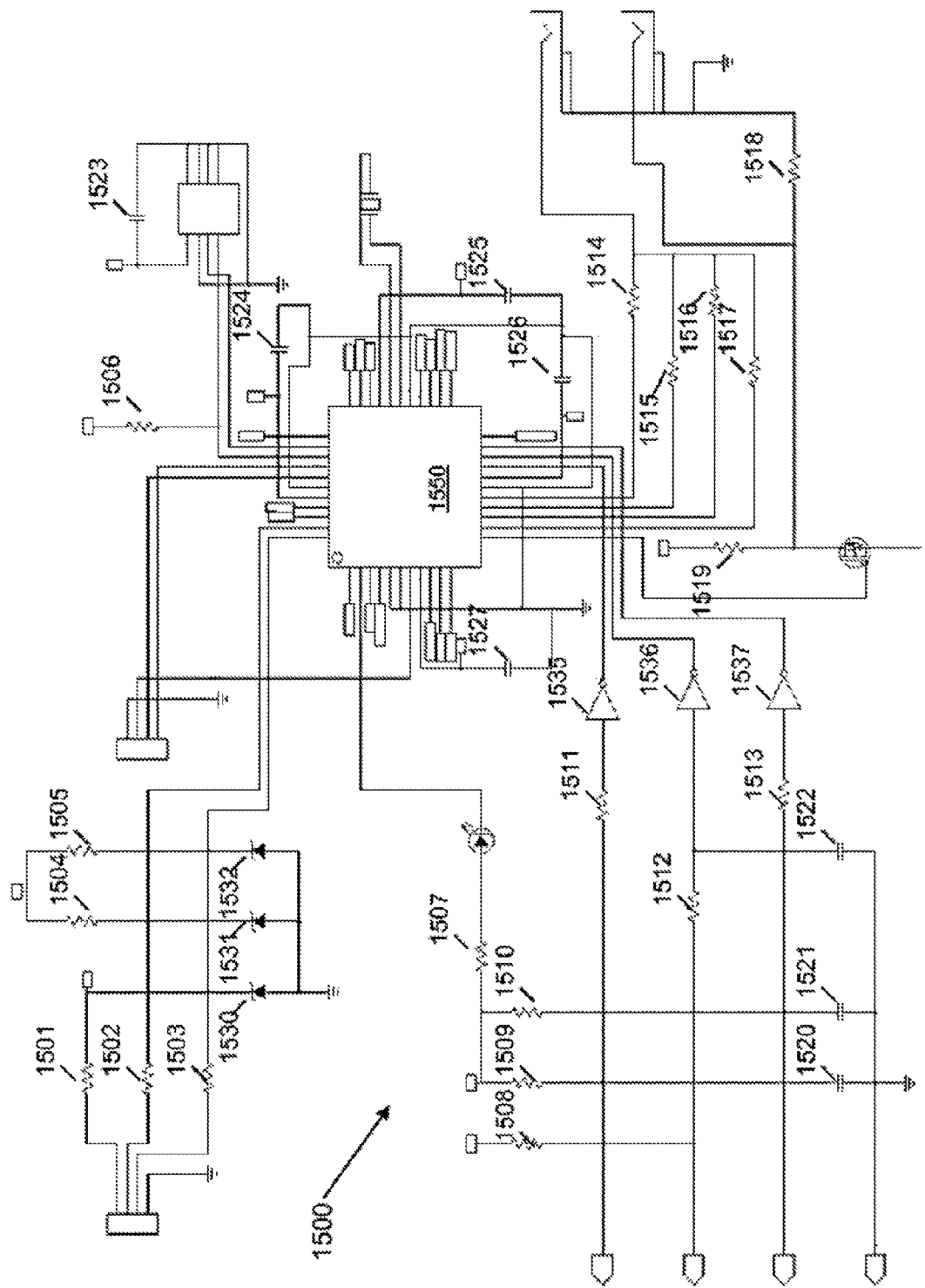
Figure 16:
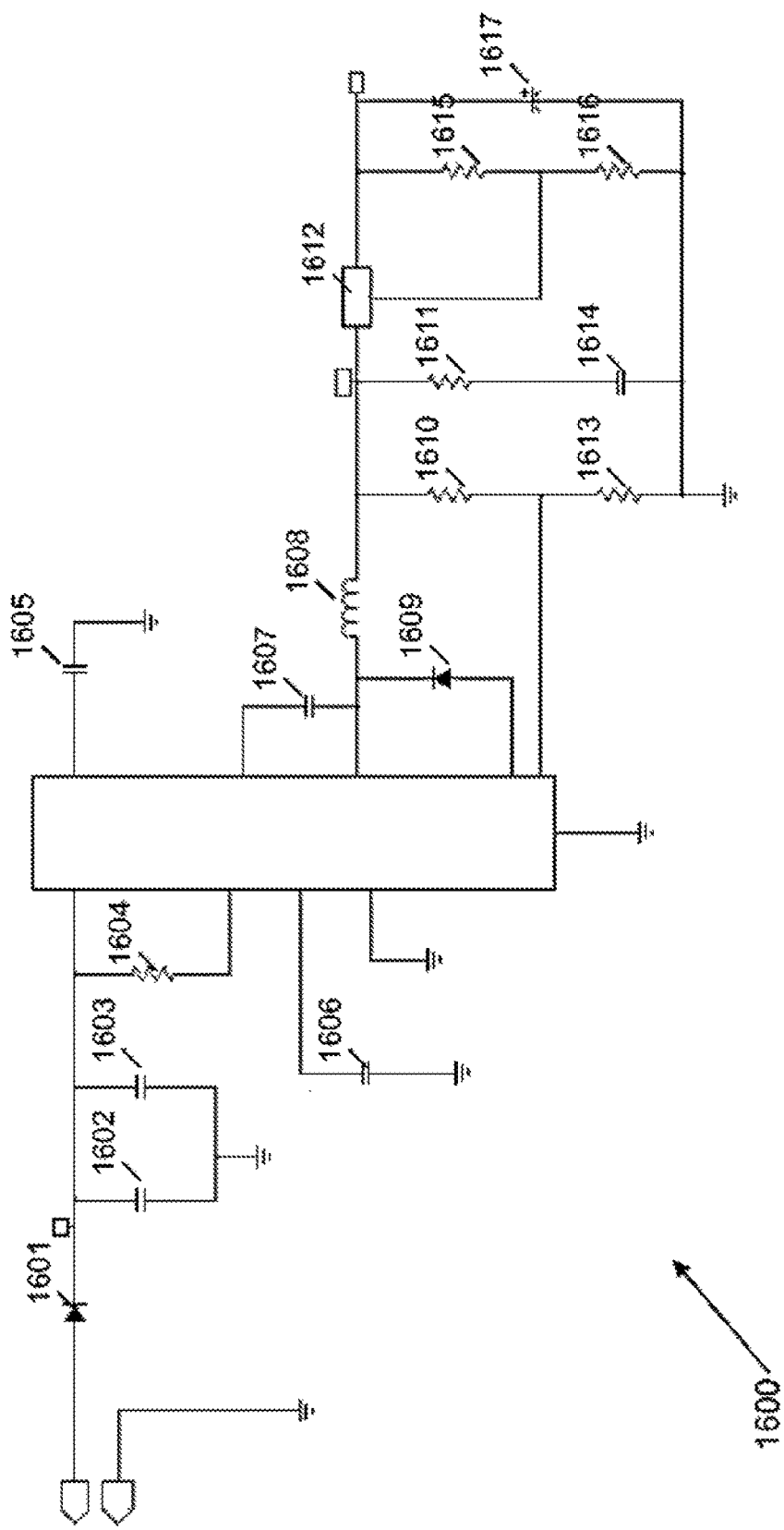
Figure 17:
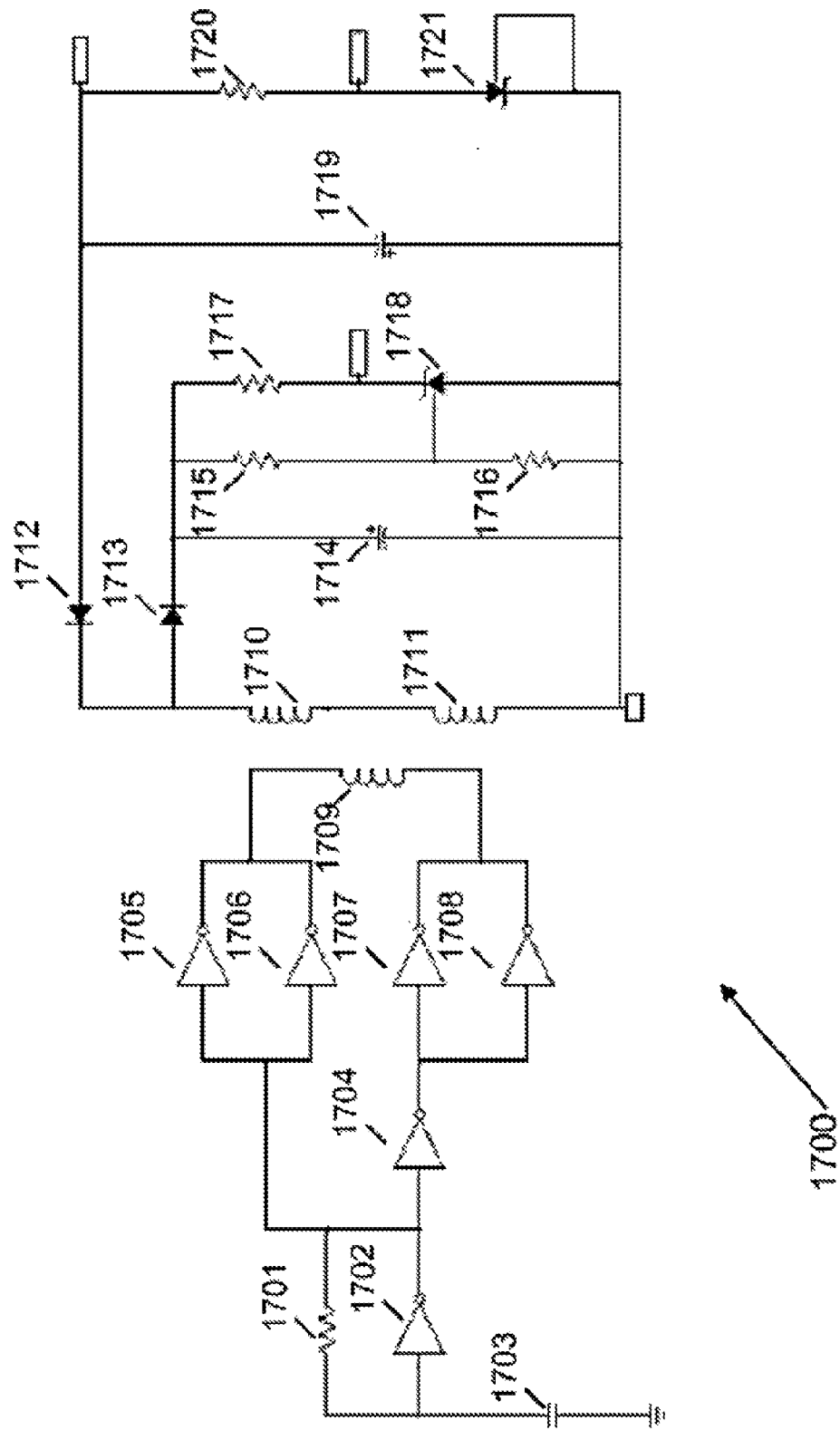
Figure 18:
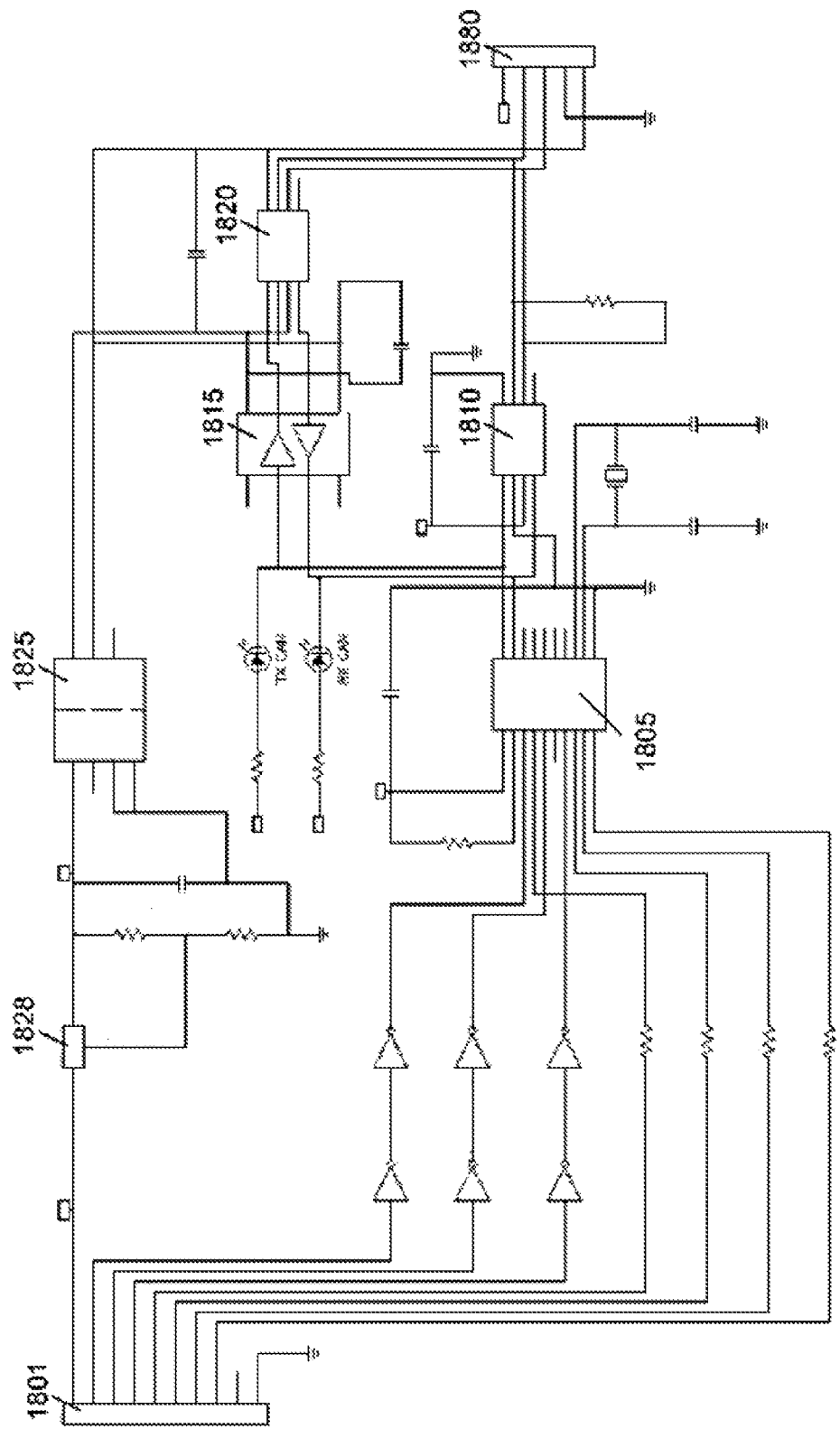

The foregoing and other objects, aspects, features, and advantages of the present invention will become more apparent and better understood by referring to the following description taken in conjunction with the accompanying drawings, in which:

FIG. 1 is a block diagram depicting an exemplary embodiment of a battery management system connected to a battery pack;

FIG. 2 is a block diagram depicting an exemplary arrangement of battery unit monitoring modules of the battery management system with respect to the battery units of the battery pack;

FIG. 3 is a block diagram depicting connections within the battery management system between the computing device and the battery unit monitoring modules;

FIG. 4 is a diagram depicting connections between battery unit monitoring modules;

FIG. 5 is a hybrid block and circuit diagram depicting an exemplary battery unit monitoring module;

FIG. 6 is a circuit diagram of an exemplary embodiment of a battery unit monitoring module;

FIG. 7 is a circuit diagram of an exemplary embodiment of the interface for a computing device;

FIG. 8 is a circuit diagram of an exemplary embodiment of a battery unit balancing system in a battery unit monitoring module;

FIG. 9 is a block diagram depicting an exemplary embodiment of the computing device of the battery management system;

FIG. 10 is a block diagram depicting an exemplary embodiment of the alarm output system of the computing device;

FIG. 11 is a circuit diagram depicting an exemplary embodiment of the alarm output system of the computing device;

FIG. 12 is a block diagram depicting an exemplary embodiment of the connection fault detection system of the computing device;

FIG. 13 is a circuit diagram depicting an exemplary embodiment of the connection fault detection system of the computing device;

FIG. 14 is a circuit diagram depicting an exemplary embodiment of the pack voltage and pack current input systems of the computing device;

FIG. 15 is a circuit diagram depicting an exemplary embodiment of the processor of the computing device;

FIG. 16 is as circuit diagram depicting exemplary embodiments of power supplies used with the battery management system;

FIG. 17 is a circuit diagram depicting an isolated power supply to power the circuits of FIG. 14; and FIG. 18 is a circuit diagram depicting exemplary embodiments of a controller area network (CAN) interface.

Figure 19:
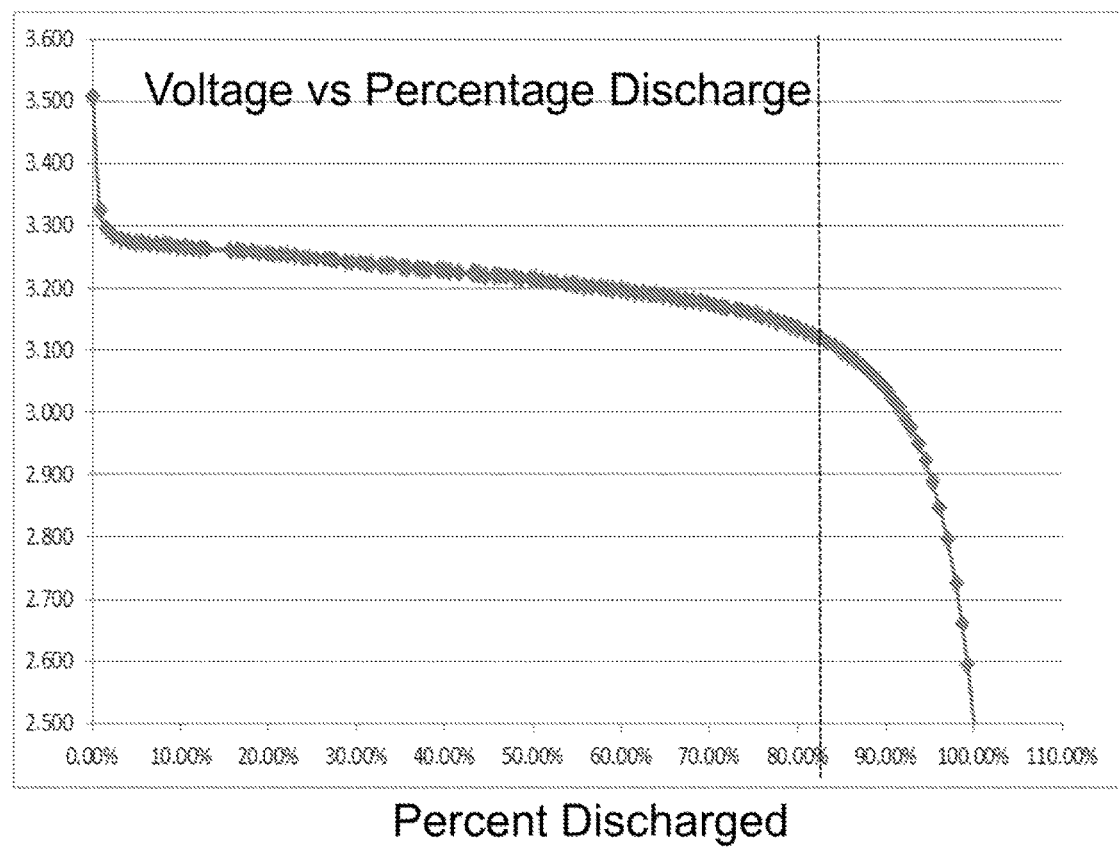

FIG. 19 shows an exemplary discharge profile for a lithium battery.

Figure 20A:
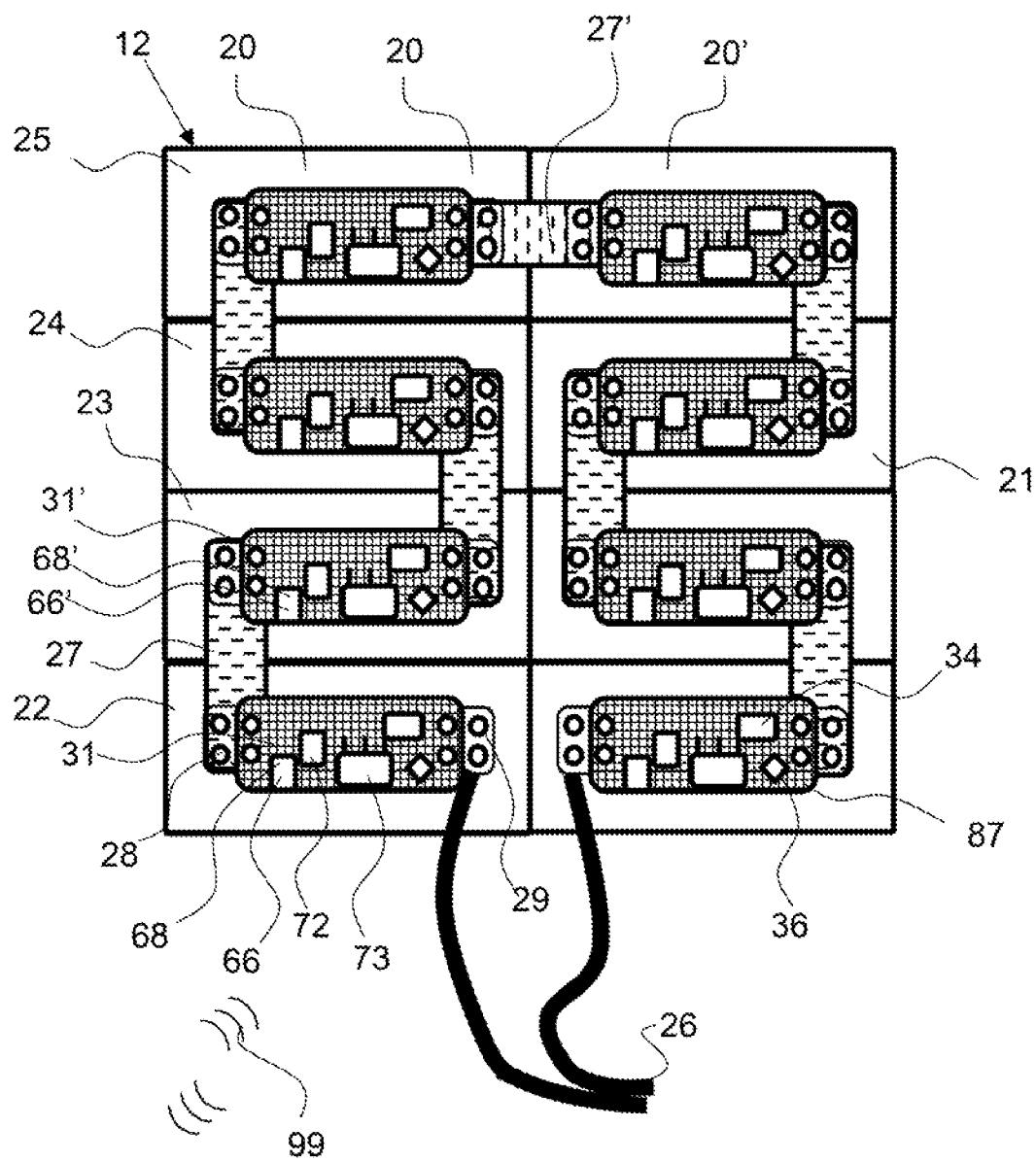
Figure 20B:
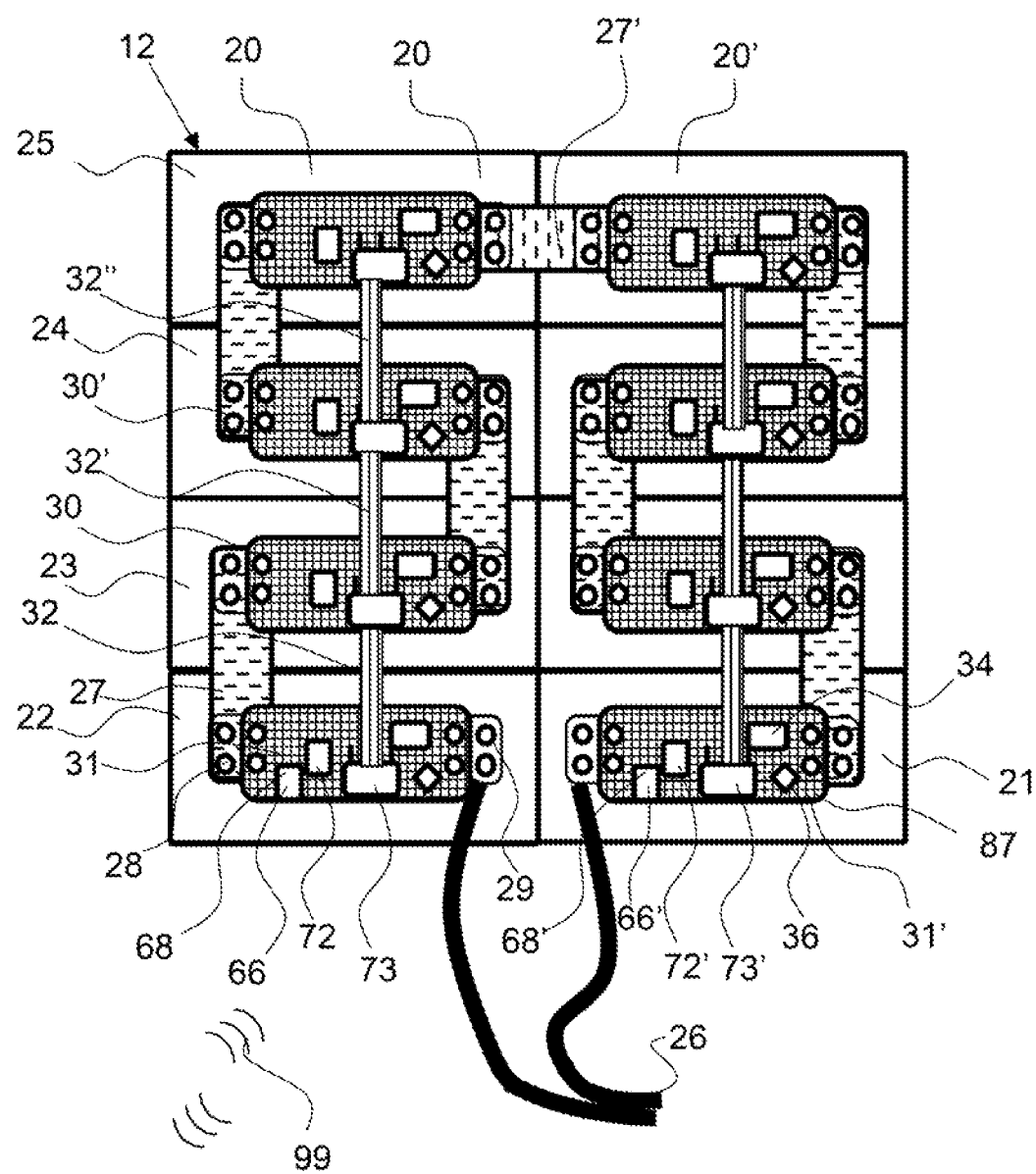
Figure 20C:
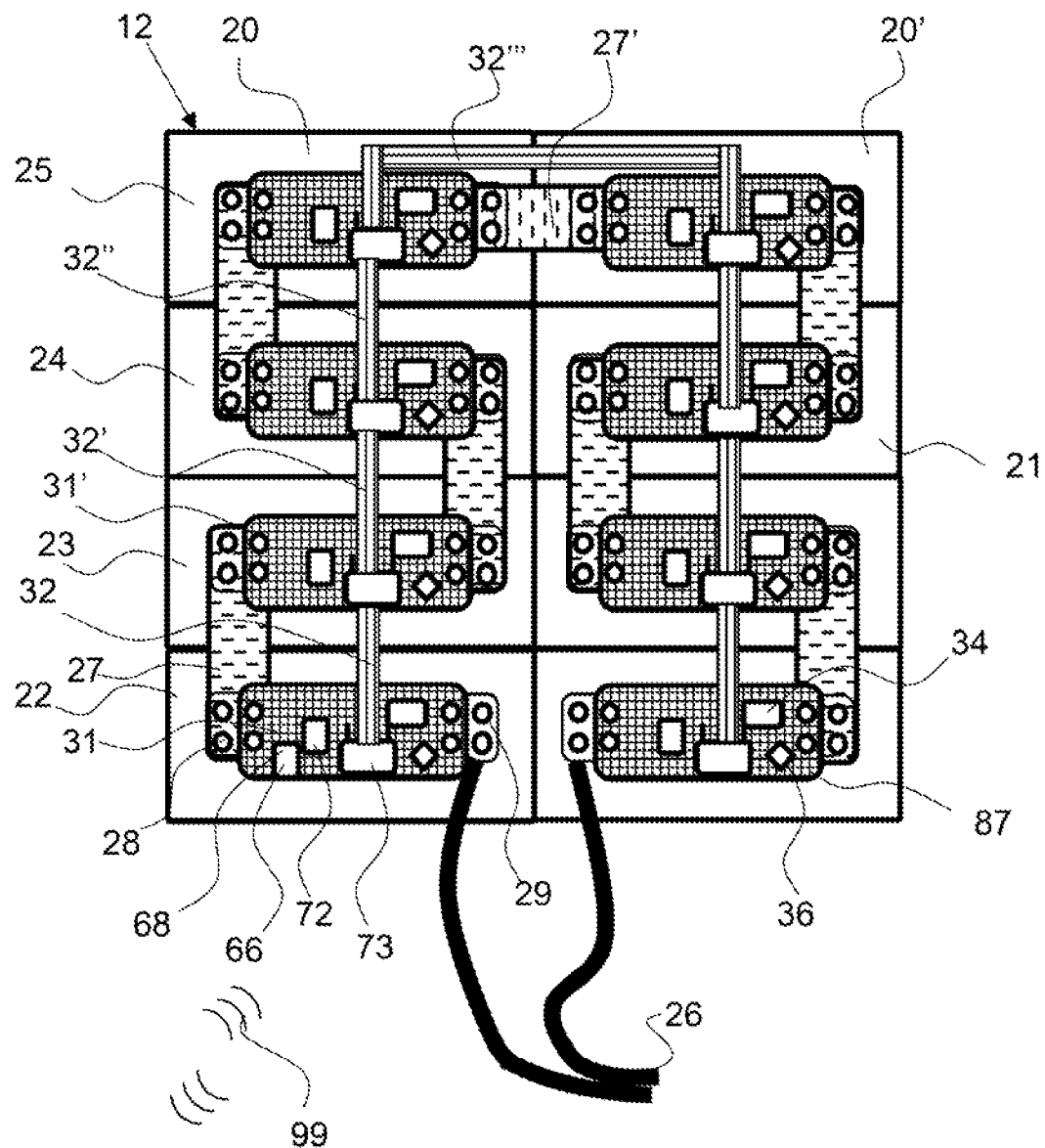

FIGS. 20A to 20C show top-down views of an exemplary battery packs comprising two battery units and wireless battery monitoring modules configured thereon.

Figure 21:
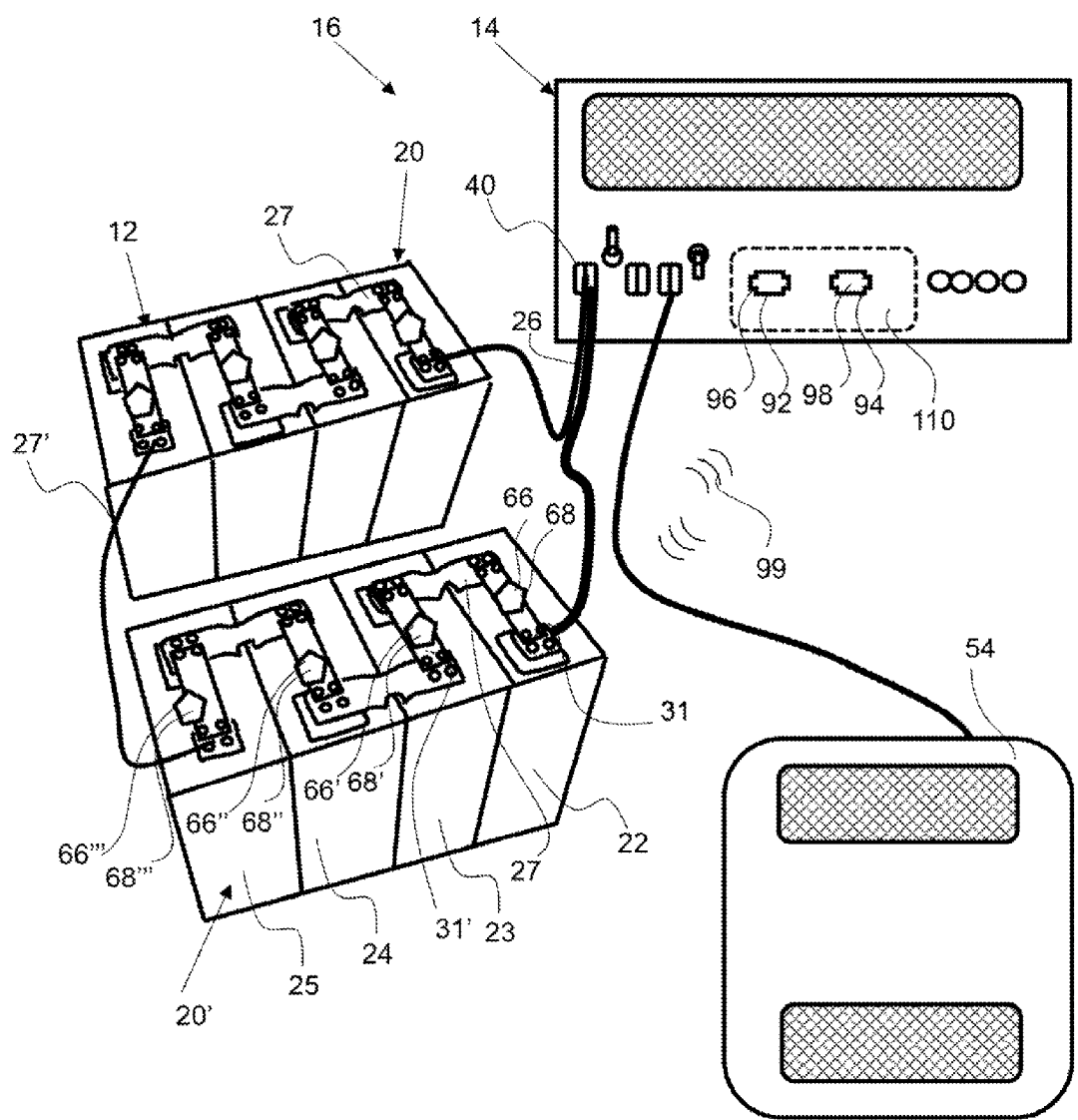

FIG. 21 shows a perspective view of an exemplary battery management system comprising wireless battery unit monitoring modules.

Corresponding reference characters indicate corresponding parts throughout the several views of the figures. The figures represent an illustration of some of the embodiments of the present invention and are not to be construed as limiting the scope of the invention in any manner. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

Certain exemplary embodiments of the present invention are described herein and illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

The present disclosure describes, among other things, certain embodiments of a battery management system. The management system obtains and displays data about battery units in a battery pack. The management system can monitor the voltage and temperature of the individual battery units and/or the entire battery pack. If the management system discovers any of the battery units pose a concern (e.g., the voltage is over or under limits, or the battery unit is overheating), the system can take measures to prevent damage to itself or the battery pack or to alleviate the concern. The system can also take comparable measures if the system detects a connection between any of the battery units and ground. Thus, the battery management system can maintain the consistent operation of the system the battery pack powers, such as an electric vehicle.

Referring now to FIG. 1, a block diagram of an exemplary embodiment of a battery management system 100 connected to a battery pack 190 is shown and described. The battery management system 100 includes battery unit monitoring modules 105 (e.g., sense boards), a computing device 110, and a display 115 (e.g. a monitor such as an LCD monitor or a monitor incorporated into another device, such as a DVD player). The computing device 110 can measure voltage and/or current for the entire battery pack 190 and output the data to the display 115. In various embodiments, the computing device 110 can determine the state of charge of the battery pack 190 by measuring the amount of current that flows in or out of the battery pack 190. The battery pack 190 can integrate the amount of current to determine the state of charge. In some embodiments, when the battery pack 190 reaches a minimum, predetermined voltage, the computing device 110 can set the pack's 190 state of charge to about 0%. When the battery pack 190 reaches a maximum, predetermined voltage, the computing device 110 can set the state of charge to about 100%.

In some embodiments, the battery pack 190 may include a plurality of battery units 195 (e.g., battery cells). Each battery unit may include a battery cell or a plurality of battery cells. The battery pack 190 can connect to an external load 198, such as a motor for an electric vehicle. Each battery unit monitoring modules 105 of the management system 100 can connect to a battery unit 195. A monitoring module 105 can obtain data, such as voltage and/or temperature, for the battery unit 195 connected to the module 105. The monitoring modules 105 can transmit the data to the computing device 110, which can output the data to the display 115.

In some embodiments, the computing device 110 may be configured to operate with a predetermined, fixed number of battery unit monitoring modules 105. In some embodiments, the computing device 110 may be configured to scan the modules 105 to determine the number of modules 105 present. The computing device 110 can scan the battery unit monitoring modules 105 to determine the number of monitoring modules 105 in the system 100. For example, in some embodiments, the computing device 110 can output a scan signal to the first monitoring module 105. In response, the monitoring module 105 can return battery unit voltage and temperature data to the computing device 110 and can output a scan signal to a successive monitoring module 105. In some embodiments, the monitoring module 115 can also return battery unit voltage and temperature data to the computing device 110, and can output a scan signal to the next module 105. Thus, the computing device 110 can count the number of monitoring modules 105 by the number of voltage and temperature data packets received. Further, the computing device 110 can number as monitoring module 105 and/or battery unit 195 based on the module's 105 or unit's 195 position order of scan signals received. In some embodiments, a user can configure the computing device 110 to set the number of monitoring modules 105 or to instruct the device 110 to scan the modules 105 and obtain the number of modules itself.

The computing device 110 can detect error conditions for individual battery units 195 and/or the entire battery pack 190. Exemplary error conditions can include conditions such as high voltage conditions, low voltage conditions, high current conditions, and high temperature condition. Another exemplary error can be a connection fault condition, e.g., a connection between at least one battery unit 195 and a contact point with a zero-voltage reference level, such as a chassis of an electric vehicle.

When an error is detected, the computing device 110 can initiate a measure based on the error condition. For example, if the computing device 110 detects a high voltage condition for the entire battery pack 190, the computing device 110 can inactivate a device that charges the pack 190 (not shown). In another example, if the computing device 110 detects a first low voltage condition, the computing device 110 can output a low voltage warning to the display 115. If the battery pack's 190 voltage drops further, triggering a second low voltage condition, the device 110 can inactivate a load connected to the battery pack 190, such as a motor controller of an electric vehicle.

Referring now to FIG. 2, a block diagram of an exemplary arrangement of battery unit monitoring modules 105 and battery units 195 in a pack 190 is shown and described. In this embodiment, the monitoring modules 105 are connected to the battery units 195, which are connected in series. Each monitoring module 105 can be connected to a single battery unit 195. The battery unit 195 can supply the connected monitoring module 105 with power for performing its operations.

FIG. 3 is a block diagram depicting connections within the battery management system 100 between the computing device 110 and the battery unit monitoring modules 105. The computing device 110 includes an output data request port (also referred to herein as an "enable output") and an input data port. Each monitoring module 105 includes an output data port, an input data request port (also referred to herein as an "enable input"), and an output data request port. Each monitoring module's 105 output data port is connected in parallel to the computing device's 110 input data port.

The computing device's 110 output data request port is connected to the first one of the battery unit monitoring module's 105a input data request port. The monitoring module's 105a output data request port is connected to the input data request port of the successive monitoring module 105b. In turn, the monitoring module's 105b output data request is connected to the input data request port of the next monitoring module 105c. The remaining monitoring modules 105 are connected in the same manner. The communications of the computing device 110 and battery unit monitoring modules 105 described herein are transmitted from and received at these ports, as would be understood by one of ordinary skill in the art. Further, in various embodiments, the computing device 110 and monitoring modules 105 include voltage and ground connections such that the computing device 110 can provide power (e.g., 12V) and ground to the monitoring modules 105.

In operation, to obtain data about the battery units 195, the computing device 110 sends a data request signal (also referred to herein as an "enable signal" or an "enable pulse") to the first battery unit monitoring module 105a. In response, the monitoring module 105a transmits data about a connected battery unit 195a to the computing device 110. After the module 105a finishes transmitting data, the module 105a sends a data request signal to the second battery unit monitoring module 105b. In response, the monitoring module 105b transmits data about a connected battery unit 195b to the computing device 110. Alley the module 105b finishes transmitting data, the module 105b sends a data request signal to the third battery unit monitoring module 105c, and the process continues for the rest of the monitoring modules 105.

Using this communication system, the computing device 110 can match data with a battery unit according to the order in which the device 110 receives data. Thus, the first set of data can be matched to the first battery unit 195a, the second set of data to the second unit 195b, and so forth. In this manner, the computing device 110 uses few ports for obtaining data and matching the data to battery units 195. In some embodiments, such a battery management system 100 may eliminate the needs for dedicated addressing ports, addressing switches, and/or jumpers.

When the computing device 110 does not receive data from a battery unit 195 for at least a predetermined period of time (e.g., 20 ms, although other times may be used), the computing device 110 can conclude that data collection for the battery pack 190 has been completed. The computing device 110 can obtain another set of data by transmitting another data request to the first battery unit monitoring module 105a, thereby restarting the data collection process. In some embodiments, the computing device 110 can collect data about the battery units 195, e.g., once per 1-2 seconds.

In some embodiments, the computing device 110 can first compare the number of data received with the number of monitoring modules 105. If the numbers match, the computing device 110 can determine all the monitoring modules 105 are operational and continue obtaining data about the battery units 195. If the numbers do not match, the computing device 110 can conclude that at least one monitoring module 105 and/or battery unit 195 is not operational. The computing device 110 can generate and output an error message to the display 115. Since the modules 105 transmit data to the computing device 110 in sequential order, the computing device 110 can identify the non-operational module 105 or unit 195 according to the number of data received. In this manner, the computing device 110 can inform a user of physical locations of faults in the monitoring modules 105 or battery pack 190, allowing the user to troubleshoot problems.

Regarding the individual monitoring modules 105, in some embodiments, a module 105 can measure data for a connected battery unit 195 upon receiving a data request signal. In some embodiments, a module 105 can measure and store data in a buffer. Then, when the module 105 receives the data request signal, the module 105 may access the buffer and may transfer the data stored therein to the computing device 110.

The monitoring module 105 can transmit the data to the computing device 110 in a human readable form. The monitoring modules 105 can transmit the data via an asynchronous serial protocol, such as protocols used for RS-232 or USB connections. The monitoring modules 105 can transmit the data at any rate and with any number of start and/or stop bits. For example, a module 105 can transmit at 9600 Baud with 1 start bit and 1 stop bit.

Referring now to FIG. 4, as diagram depicting connections between battery unit monitoring modules 105 is shown and described. In some embodiments, wiring 400 (e.g., ribbon cable, 4-wire round shape harnesses) can be used to connect the monitoring modules 105 to one another. In some embodiments, for each monitoring module 105, the output data port can be located in the center of a module's 105 interface. In some embodiments, the input data request port and the output data request port can be symmetrically located on opposite sides of the output data port. By orienting each battery unit monitoring module 105 in an opposite direction from adjacent modules 105, wiring 400 can connect the output data request port of one module 105 to the input data request port of the successive module 105. Due to the orientation of the ports, the wiring 400 need not be twisted or folded. Further, the wiring 400 can connect all the output data ports to the input data port of the computing device 110. When a monitoring module 105 transmits data for its connected battery unit 195, the data can be sent across each portion of wiring 400 connecting the monitoring modules 105 before the data arrives at the computing device 110.

FIG. 5 is a hybrid block and circuit diagram depicting an exemplary battery unit monitoring module 105. The monitoring module 105 includes terminals 502 and 503, a microprocessor 505, a reverse connection protection system 510, a battery unit balancing system 515, a voltage regulator 520, resistors 525, 526 for sampling a battery unit's 195 voltage, and a temperature monitoring device 527 (e.g., a thermistor) for sampling a battery unit's 195 temperature. The monitoring module 105 also includes a receiver 540 for receiving a data request signal from a computing device 110 or monitoring module 105, a driver 541 for transmitting data of the connected battery unit 195 to the computing device 110, and a driver 542 for transmitting a data request signal to another monitoring module 105.

A battery unit 195 connects to the monitoring module 105 at terminals 502 and 503. Thus, the battery unit 195 applies its voltage to the reverse connection protection system 510. If the voltage is sufficiently high, the protection system 510 conducts and applies the voltage to the voltage regulator 520, resistors 525, 526, temperature monitoring device 527, and balancer 515. If the battery unit 195 is improperly connected to the terminals 502, 503 (e.g., with incorrect polarity), the reverse connection protection system 510 does not conduct, thereby protecting the module 105 from potentially damaging voltages.

When the protection system 510 conducts, the voltage regulator 520 can draw upon the battery unit's 195 voltage to supply a stable voltage (e.g., 2V) for the monitoring module 105. In particular, this voltage can power the microprocessor 505. The microprocessor 505 can obtain the battery unit's 195 voltage via resistors 525 and 526 and/or the temperature via temperature monitoring device 527. In some embodiments, the microprocessor 505 can sample the values on the resistors 525, 526 and temperature monitoring device 527 to obtain the voltage and temperature. The microprocessor 505 can store the values in an internal memory.

In some embodiments, when the receiver 540 receives a data request signal, the receiver 540 transmits the signal to the microprocessor 505. In response, the microprocessor 505 obtains the voltage and temperature of the battery unit 195, either by measuring the values on the resistors 525, 526 and temperature monitoring device 527 or by accessing stored values in an internal memory. The microprocessor 505 transmits the values to the driver 541, which drives the values back to the computing device 110 via, for example, asynchronous serial ASCII communication. At substantially the same time, the microprocessor 505 can generate and output a data request signal to the driver 542. The driver 542 drives the data request signal to the next monitoring module 105 for obtaining data about its connected battery unit 195.

Referring now to FIG. 6, a circuit diagram of an exemplary embodiment of a battery unit monitoring module 105 is shown and described. In this embodiment, the terminals 602, 603 correspond to the terminals 502, 503 of FIG. 5. The protection system 510 can be a metal-oxide-semiconductor field effect transistor (MOSFET) 605, such as a p-type MOSFET. Terminals of the battery unit 195 can connect to both the source and base of the MOSFET 605. When the battery unit's 195 voltage is sufficiently high, the voltage activates the MOSFET 605. As the MOSFET 605 conducts, the battery unit 195 applies its voltage to the voltage regulator 610. If the battery unit's 195 voltage is insufficiently high, or its polarity is reversed, the MOSFET 605 does not conduct, thereby protecting the module 105 from potentially damaging voltages. In this manner, the MOSFET 605 can operate as a low voltage drop diode.

The voltage regulator 610 can be an integrated circuit (e.g., a LP2951) which can use a transistor 611, two operational amplifiers 612, 613, and two resistors 614, 615 to regulate a voltage. Resistors 616, 617 can divide the output of the voltage regulator 610 to, for example, 2V. The divided voltage can be fed back to the error amplifier 612, and the regulator 610 can adjust the output accordingly. In this manner, the voltage regulator 610 can output a substantially constant voltage. The capacitor 618 can filter the divided voltage before supplying the voltage to a microprocessor 620. Further, a power supply can power a clock generator (with capacitors 623, 624, an oscillator 625, resistor 626, and buffers 627, 628) to generate a clock signal. The clock signal can be provided to the microprocessor 620 for its operations.

The battery unit 195 can connect, via the terminals 602, 603, to resistors 629, 630 and a thermistor 631. A node between the resistors 629, 630 and a node adjacent to the thermistor 631 can connect to input ports of the microprocessor 620, which in turn can connect to an internal analog-to-digital converter (also referred to herein as A/D converter). One of the inputs to the internal A/D converter can sample the voltage between the resistors 629, 630 to determine the voltage of the battery unit 195. Another input to the internal A/D converter can sample the temperature of the battery unit 195, expressed as a voltage, via the thermistor 631. The microprocessor 620 can store the voltage and temperature in an internal memory. In some embodiments, the microprocessor 620 connects to separate A/D converters that sample the voltage and temperature.

The microprocessor 620 can receive a data request signal via the receiver 640 (e.g., an optocoupler). In response, the microprocessor 620 can obtain the voltage and temperature of the battery unit 195 and transmit the values to the driver 641, which drives the values back to the computing device 110. At substantially the same time, the microprocessor 620 can generate and output a data request signal. The data request signal can connect to the base of as transistor 650. When the signal turns on the transistor, a current flows through the driver 642 to output another data request signal to the next monitoring module 105.

FIG. 7 is a circuit diagram of an exemplary embodiment of an interface 700 for the computing device 110. The interface 700 can be used by the computing device 110 for communicating with to battery unit monitoring modules 105. The computing device 110 can apply a data request signal to the gate of a transistor 705, such as a metal-oxide-semiconductor field-effect transistor (MOSFET). In response, the transistor 705 conducts and current flows from the voltage source 710 through the resistors 715, 716. The voltage that develops at the node between the resistors 715, 716 activates the transistor 720. As a result, current flows from the voltage source 710 through the transistor 720 and resistor 721 to output a data request signal (e.g., a logic high signal) for the first battery unit monitoring module 105.

The circuit can receive a data signal (e.g., as 12V signal) through the TX pins on a connector. Resistors 725, 726 can divide the data signal, and the Zeller diode 730 can clamp the data signal to a voltage substantially equal to the voltage supplied to the battery unit monitoring module's microprocessor (e.g., 3.3V). An inverter 735, such as a Schmitt Trigger inverter, can eliminate noise and sharpen the rise and fall times of the divided and/or clamped data signal before passing the data signal to the microprocessor of the computing device 110.

In various embodiments, the interface 700 can be located on the same board as the other components of the computing device 110. In some embodiments, the communication interface can be isolated from those other components.

FIG. 8 is a circuit diagram of an exemplary embodiment of a balancing unit 800 of a battery unit monitoring module 105. The operation of the balancing unit is described in U.S. application Ser. No. 12/939,889, entitled "Battery Unit Balancing System," filed Nov. 4, 2010, the contents of which are hereby incorporated by reference in their entirety.

FIG. 9 is a block diagram depicting an exemplary embodiment of the computing device 110 of the battery management system 100. The computing device 110 can include a central processing unit (CPU, e.g. 8-core processor) 905 and a memory 910 (e.g., electrically erasable programmable read-only memory, or EEPROM serial memory) that stores a program with executable instructions. The program can be loaded into the memory 910 from an external device connected via, for example, the bus interface 965 or a USB cable. The CPU 905 can load and execute instructions from the memory 910 to perform its operations. The program may include configuration data, such as the predetermined number of battery unit monitoring modules 105 in the system 100 or the threshold battery unit voltage or temperature that would trigger an error condition. In some embodiments, the program may obtain the configuration data from values input by a user of the system 100.

The computing device 110 can use an analog-to-digital (A/D) converter 915 to measure the voltage of the battery pack 190. The A/D converter 915 can sample the voltage to obtain a value. The computing device 110 can use an analog-to-digital (A/D) converter 916 to measure the current of the battery pack 190. In sonic embodiments, the A/D converter 915 is connected to a shunt, which in turn is connected to a terminal of the battery pack 190 and a terminal of the external load 198. The shunt can be a resistor that develops a voltage drop proportional to the battery pack's 190 current (e.g., 0.0001 Ohms developing a voltage drop of 0.1 mV/A). An amplifier 917 can amplify the value of the current before the A/D converter 916 samples the current. The A/D converters 915, 916 can direct the battery pack voltage and current to an isolation barrier 920 controlled by a signal from a connection fault detector 925. In some embodiments, the A/D converters 915, 916 are on the same board as the CPU 905, isolated, and/or both.

The connection fault detector 925 can signal the presence of a connection between a battery unit 195 and a zero-voltage reference level. For example, the zero-voltage reference level can be the battery pack's 190 enclosure or chassis, and the connection between a battery unit 195 and the chassis would represent a hazard to service personnel. When one or more battery units 195 within the battery pack 190 contacts a point at the zero-voltage reference level, the contact can cause current to flow from the battery unit 195. The connection fault detector 925 detects the connection and outputs a signal to the CPU 905 which will display a warning indicating this connection on the display device 115.

The CPU 905 can connect to the battery unit monitoring modules 105 to obtain data about the individual battery units 195, as described in reference to FIGS. 3-5. The CPU 905 can process data about the individual battery units 195 and/or battery pack 190 to create a composite video signal. A digital-to-analog (D/A) converter 930 (e.g., as 3-bit converter) can produce the composite video signal from digital to analog format so the signal can be displayed on a display 115.

If the CPU 905 detects an error condition, the CPU 905 can transmit an error signal to an alarm output system 940. The system 940 can be used to control a component and/or device that responds to the error signal (e.g., a charger that stops charging the battery pack 190, or a motor controller of an electric vehicle that stops discharging the battery).

The computing device 110 can include power supplies 960 (not shown on FIG. 9). The power supplies 960 supply voltages to components of the battery management system 100. In some embodiments, a power supply 960 can include an internal voltage regulator to provide a constant voltage. The power supplies 960 can be isolated from the other components of the computing device 110 to prevent damage to the device 110.

The computing device 110 can include an interface 965, such as a controller area network (CAN) interface. The interface can include ports, such as parallel port pins. The computing device 110 can connect to external devices via an interface (not shown). For example, the device 110 can connect to another computing device to receive a program to be stored in the memory 910.

The computing device 110 can include a port 970 for receiving a page select signal. A page can correspond to a format for displaying data about a battery unit 195 within the battery pack 190. For example, one page can display the data for the entire pack 190. Another page can display the voltages and temperatures of eight, twenty, or any other number of battery units 195. Successive pages can display the same information for adjacent sets of battery units 195. The computing device 110 can receive the page select signal from a switch mounted in a dashboard in an electric vehicle, for example (not shown). In response, the computing device 110 can output the selected page containing battery pack data to the display 115.

FIG. 10 is a block diagram depicting an exemplary embodiment of the alarm output system 940 of the computing device 110. The alarm output system 940 receives an error signal from the computing device 110. The alarm output system 940 outputs a binary signal according to the error signal. If the error signal corresponds to an off signal, the system 940 allows current to flow to a ground reference, thereby outputting a logic low signal (e.g., 0V). If the error signal corresponds to an on signal, the system 940 allows current to flow from a voltage source, such as 12V. In some embodiments, the system 940 does not allow current to flow until the error signal lasts at least 30 seconds. In this manner, the system 940 turns on or off external devices according to the presence of an error.

FIG. 11 is a circuit diagram depicting an exemplary embodiment of the alarm output system 940 of the computing device 110. The alarm output system 940 includes a voltage source 1101, two resistors 1103, 1104, four transistors (e.g., metal-oxide-semiconductor field-effect transistors or MOSFETs) 1105, 1106, 1107, 1108 configured to form an H bridge, and two transistors 1120, 1121 that operate the alarm output system 940. Transistors 1105, 1108 can be of opposite polarity from transistors 1106, 1107. The alarm output system 940 can apply one or more received error signals to the transistors 1120, 1121 and output one or more command signals corresponding to the error signals at terminals 1130, 1131.

In operation, an error signal can be applied to transistor 1120 and/or transistor 1121. If the computing device 110 detects a low voltage condition, the device 110 can apply an error signal to transistor 1120. As transistor 1120 conducts, the voltage applied to the gates of transistors 1107, 1108 by the voltage source 1101 drops. The voltage differential between the source and gate of transistor 1107 decreases to turn the transistor 1107 off. The voltage differential between the source and gate of transistor 1108 increases to turn the transistor 1108 on. As transistor 1108 conducts, current flows from the voltage source 1101 through the transistor 1108 to the output terminal 1130. The voltage that develops on the output terminal 1130 can be used to shut off a motor controller, by way of example.

If the computing device 110 detects a high voltage condition, as high current condition, or a high temperature condition, the device 110 can apply an error signal to transistor 1121. As transistor 1121 conducts, the voltage applied to the gates of transistors 1105, 1106 by the voltage source 1101 drops. The voltage differential between the source and gate of transistor 1106 decreases to turn the transistor 1107 off. The voltage differential between the source and gate of transistor 1108 increases to turn the transistor 1105 on. As transistor 1105 conducts, current flows from the voltage source 1101 through the transistor 1105 to the output terminal 1131. The voltage that develops on the output terminal 1130 can be used to shut off a battery charger or turn on a fan, by way of example.

FIG. 12 is a circuit diagram depicting an exemplary embodiment of the connection Fault detection system of the computing device. The connection Lath detection system includes an optocoupler 1205 with a light emitting diode 1210 and a transistor 1215, such as a phototransistor. One terminal of the light emitting diode 1210 connects to ground (also referred to herein as "a node at a ground zero reference level"), such as a chassis of an electric vehicle. The other terminal of the light emitting diode 1210 connects to a current sink 1220. One terminal of the transistor 1215 connects to a voltage source 1225. The other terminal connects to a node corresponding to the output 1228 of the optocoupler 1205 (also referred to herein as the "output node"). This node connects to a resistor 1230 that also connects to a ground zero reference level, which can be electrically isolated from the battery pack 190. The current sink 1220 connects to the negative terminal of a voltage source 1235. The positive terminal of the voltage source 1235 connects to the negative terminal of at least one battery unit 195 of the battery pack 190.

In operation, when none of the terminals of the battery units 195 connect to ground, current does not flow through the light emitting diode 1210 of the optocoupler 1205. The light emitting diode 1210 does not activate the transistor 1215, and the transistor 1215 does not conduct. Because the node 1228 corresponding to the optocoupler's 1205 output is disconnected from the voltage source 1225, any charge at the node drains through the resistor 1230 to ground. In this manner, the optocoupler 1205 outputs a logic low signal, such as 0V, indicating that a connection fault has not been detected.

When a positive terminal of a battery unit 195 does connect to a zero-voltage reference level, current flows through the light emitting diode 1210 to the current sink 1220. The current activates the transistor 1215 so the transistor 1215 conducts. Current flows from the voltage source 1225, building charge at the output node 1228. Thus, the optocoupler 1205 outputs a logic high signal indicating that a connection fault has been detected. The logic high signal can be applied to CPU 905, which can output a message to the display device warning an operator of the battery unit management system of a potentially hazardous connection fault.

The voltage sources 1225, 1235 can have any voltage. For example, voltage source 1225 can provide 3.3V. Voltage source 1235 can provide 5.0V. The current sink 1220 can limit the current flowing through itself and the light emitting diode 1210 to any current, such as a minimum safe level of current. For example, the current sink 1220 can limit the current to 2 mA. The current sink 1220 can operate over a range of voltages of the battery pack 190, such as the voltages between the battery pack's 190 positive and negative terminals. In some embodiments, this range can be from about 5V to about 500V. In some embodiments, the current sink 1220 can operate at voltages that exceed the voltage at the positive terminal of the battery pack 190.

FIG. 13 is another circuit diagram depicting an exemplary embodiment of the connection fault detection system of the computing device. This embodiment includes all the components described in reference to FIG. 12. In addition, in this embodiment, the current sink 1220 includes a voltage source 1305, a first resistor 1310, a first transistor 1315, a second transistor 1320, and a second resistor 1325. The voltage source 1305 connects to one terminal of the first resistor 1310. The other terminal of the first resistor 1310 connects to the gate of the first transistor 1315 and the emitter of the second transistor 1320. The source of the first transistor 1315 connects to the optocoupler 1205. The drain of the first transistor 1315 connects to the base of the second transistor 1320 and one terminal of the second resistor 1325. The other terminal of the second resistor 1325 connects to the collector of the second transistor 1315 and the negative terminal of the voltage source 1235.

In operation, current flows from the voltage source 1305 through the first resistor 1310 to activate the first transistor 1315 such that the first transistor 1315 conducts. When a terminal of a battery unit 195 connects to ground, current flows through the optocoupler 1205, the first transistor 1315, and the second resistor 1325. The voltage that develops across the second resistor 1325 activates the second transistor 1320. As the second transistor conducts 1320, current is diverted from the gate of the first transistor 1315. The transistors 1315, 1320 and resistors 1310, 1325 reach equilibrium such that a constant current flows through the first transistor 1315.

The transistors 1315 can be any type of transistor, such as a metal-oxide-semiconductor field-effect transistor (MOSFET), an insulated gate bipolar transistor (IGBT), or a NPN transistor. In some embodiments, a 2N3904-type transistor is used for the second transistor 1320.

FIG. 14 is a circuit diagram depicting an exemplary embodiment of the pack voltage and pack current input systems of the computing device. The battery pack 190 can connect to the systems at terminals 1401, 1402. Resistors 1405, 1406, 1407, 1408, 1409, 1410 can divide the battery pack 190 voltage from 500V to 2V, by way of example. A capacitor 1411 can filter the divided voltage, and an A/D converter 1415 can sample the voltage. The A/D converter 1415 can transmit the voltage to a processor of the computing device 110, such as CPU 905. Optocouplers 1420, 1421, 1422 can create an isolated communication interface between the A/D converter 1415 and the processor.

The voltage drop across a shunt can be input at terminal 1430. The operational amplifier 1435, resistors 1436, 1437, and capacitors 1438, 1439, 1440 can form an amplifier to amplify the voltage drop. Because the amplifier has a fixed gain, such as 80, the amplified voltage may exceed the capacity of the A/D converter 1445 that samples the voltage. Thus, resistors 1447, 1448 can form a voltage divider that divides the amplified voltage to a level the A/D converter 1445 can process. The A/D converter 1445 can sample the voltage and transmit the voltage to the processor, which can calculate the battery pack 190 current based on the value of the shunt. The A/D converter 1445 can use the same communication interface as the A/D converter 1415 to transmit its sampled voltage.

FIG. 15 is a circuit diagram depicting an exemplary embodiment 1500 of the central processing unit 905 of the computing device 110. Resistors 1501-1519, capacitors 1520-1527, Zener diodes 1530-1532, and inverters 1535-1537 condition the inputs and outputs for the central processing unit 1550.

FIG. 16 is a circuit diagram 1600 depicting an exemplary embodiment of a power supply that can be used with the battery management system 100. The power supply 1600 can be a step down switching voltage regulator. The components 1601-1616 can operate to produce a voltage, such as 5V or 12V. In particular, component 1612 can be a linear voltage regulator that accepts a voltage produced by the other components of the system and outputs a substantially constant 3.3V.

FIG. 17 is a circuit diagram 1700 depicting an exemplary embodiment of another power supply that can be used with the battery management system 100. The power supply 1700 can be an isolated power supply. Components 1701-1708 can operate as an oscillator that produces 40 KHz. The transformer with windings 1709-1711 can transfer energy produced by the oscillator to components 1712-1721, which can operate as positive and negative half-wave rectifiers and a shunt regulator. The rectifiers and shunt regulator can operate to produce a substantially constant output voltage.

FIG. 18 is a circuit diagram depicting an exemplary embodiment of a controller area network (CAN) interface used with the battery management system 100. The interface can be used to connect a CPU 905 of a computing device 110 with an external device via a CAN bus. A connector 1801 can attach to a component of the computing device 110, such as the CPU board. The other connector 1880 can attach to a CAN bus that connects to an external device. The computing device 110 and external device can communicate over the interface using a standard bus protocol such as a serial peripheral interface (SPI) protocol. In some embodiments, the devices can use handshaking signals, such as receiver buffer full and interrupt.

The interlace chip 1805 can operate in a non-isolated mode or an isolated mode. In the non-isolated mode, the interface chip 1805 communicates with the bus buffer 1810 with data received, for example, from an external CAN-enabled device. In sonic embodiments, the bus buffer 1810 can receive data from the bus ports 1880. The interface chip 1805 can send a transmit signal to the buffer 1810 so the buffer 1810 outputs its data to the bus ports 1880. The interface chip 1805 can send a receive signal so the buffer 1810 outputs its data obtained from the bus ports to the interface chip 1805.

In the isolated mode, an isolator 1815 isolates the interface chip's 1805 transmit and receive signals from a buffer 1820. The isolator 1815 can be a magnetic isolator. An isolated power supply 1825 can use a voltage from a voltage regulator 1828 to provide power for the isolator 1815 and buffer 1820. In some embodiments, the voltage regulator 1828 receives a 12V signal and outputs a 5V signal.

As shown in FIG. 20A, an exemplary battery pack 12 comprises two battery units 20 and 20', each having four individual lithium batteries 21. The first second, third and fourth batteries 22, 23, 24, 25, respectively are all connected in series by jumpers 27. A jumper 27' connects the first battery unit 20 with the second battery unit 20' thereby connecting all eight batteries in series. Wireless battery unit monitoring modules 31 are configured on each battery and each comprise a microprocessor 73 as well as an analog-to-digital converter 72. The sensors, voltage and temperature sensors for example, may provide input to an analog-to-digital converter that is then converted into a digital signal that is transmitted to a microprocessor. Each wireless battery unit monitoring module is configured between the positive 28 and negative 29 terminals of as battery. Each wireless battery unit monitoring module comprises a voltage sensor 34 and as temperature sensor 36. A circuit 87 is configured on each wireless battery unit monitoring module to determine the voltage state of each battery. A battery power cable 26 is configured to provide power to a power control system and other than this physical connector, no other physical connections are required between the battery pack and a control or battery management system. Each wireless battery unit monitoring module 31 comprises a wireless module signal receiver 68 and a wireless module signal transmitter 66. As described herein, the wireless module signal receiver 68 of the first wireless battery unit monitoring module 31 receives a wireless signal 99 from a wireless computer signal transmitter (not shown) having a data request command. The first wireless battery unit monitoring module 31 subsequently transmits a wireless signal through the wireless module signal transmitter 66 to a wireless computer signal receiver (not shown). After the computing device receives the data from the first battery 22, it then sends a subsequent wireless signal 99 comprising a data request command for the second wireless battery unit monitoring module. Again, the second wireless battery unit monitoring module 31' subsequently transmits a wireless signal through the wireless module signal transmitter 66' to a wireless computer signal receiver (not shown). This process is repeated until all of the battery data is received by the computing device. The computing device may then repeat the process by sending a new data request signal to the first wireless battery unit monitoring module.

As shown in FIG. 20B, the batteries in each battery unit 20, 20', are coupled together by module connector 32 that transmits battery data to a single wireless module signal transmitter 66, 66' on each battery unit. In this way, the number of wireless transmitters and receivers for a battery unit are reduced. As described herein, the wireless module signal receiver 68 of the first wireless battery unit monitoring module 31 receives a wireless signal 99 from a wireless computer signal transmitter (not shown) having a data request command. The first wireless battery unit monitoring module 31 subsequently transmits a wireless signal through the wireless module signal transmitter 66 to a wireless computer signal receiver (not shown). After the computing device receives the data from the first battery 22, it then sends a subsequent wireless signal 99 comprising a data request command for the second battery unit monitoring module. The microprocessor 73 of the first wireless battery unit monitoring module receives this data request command for the second battery and subsequently sends a data request signal to the second battery unit monitoring module 30. The second battery unit monitoring module then sends second battery data to the first wireless battery unit monitoring module for wireless transmission by the wireless module signal transmitter 66. This process is repeated until the computing device has received all of the data for the batteries in the first battery unit. The computing device may then send a data request signal to a second wireless battery unit monitoring module 31' and again the process may be repeated for the second battery unit 20'.

In an alternative embodiment, the computing device may send a single wireless data request signal to each battery unit, and the data requests may be sent from the first to each subsequent battery unit monitoring module in a daisy chain manner through module connectors 32. For example, the first battery unit monitoring module may comprise a wireless module signal transmitter and signal receiver 66, 68, respectively, and receive a wireless signal from the computing device having a data request command. After the first wireless battery unit monitoring module 31 sends first battery data to the computing device through the wireless signal transmitter 66, it may then send a data request to the second battery unit monitoring module 30 through the module connector 32. After the second battery unit monitoring module has sent second battery data to the first wireless battery unit monitoring module 31 for transmission to the computing device, it may then send a data request to the third battery unit monitoring module 30' through module connector 32'. Again, the third battery unit monitoring module may send third battery data to the first wireless battery unit monitoring module 31 and subsequently send a data requests to the fourth battery unit monitoring module through module connector 32". This process may until all batteries in a battery unit have provided battery data. After the last battery unit monitoring module in the daisy chain connection has sent data, there may be period of time that the computing device does not receive any data. This period of time, or delay time, may prompt the computing device to send out a new data request signal to a subsequent battery unit, or to repeat the signal to the first battery unit.

As shown in FIG. 20C, a battery pack 12 comprises eight batteries all coupled together by module connectors 32. The first battery unit 20 is couple to the second battery unit by module connector 32'''. In this embodiment, the battery pack has a single wireless module signal receiver 68 and transmitter 66. As described herein, a data request command may be sent to the first battery unit monitoring module and data request commands may be sent in a daisy chain manner as described herein. Alternatively, the computing device may send a specific data request command for each battery, and the microprocessor 73 may then retrieve the requested battery data through the module connectors 32 and send this data to the computing device through the wireless module signal transmitter 66.

As shown in FIG. 21, an exemplary battery pack 12 comprises two battery units 20 and 20, each having four individual lithium batteries 22, 23, 24, and 25. In this exemplary embodiment, only to battery power cable 26 physically couples the battery pack to the power input 40 of the control system 14 and all communication to and from the computing device 110 is wireless. The control system 14 may provide power to an electronic device 54, such as an electric vehicle, for example. A wireless computer signal transmitter 96 is coupled with the output data request port 92 of the computing device 110 and sends a wireless data request signal that is received by the wireless module signal receiver 68 on the first battery monitoring module 30. First battery data is sent wirelessly by the wireless module signal transmitter 66 to the wireless computer signal receiver 98 coupled with the input data port 94 of the computing device 110. The computing device then sends a data request signal having an address for the second wireless battery unit monitoring module 31'. The second wireless module signal receiver 68', of the second battery 23, receives this request and the second wireless battery unit monitoring module 31' then transmits a wireless signal containing the second battery data. This method is repeated until battery data for all the batteries in the battery unit, or pack, has been received by the computing device. Any of the configurations shown in FIGS. 20A-20C, may be coupled with a computing device of a battery management system 16, as described herein.

In view of the structure, functions and apparatus of the system described herein, the present disclosure provides an efficient and wireless communicating intelligent battery management system. The wireless battery management systems comprises a wireless transmitters and receivers to enable communication between a computing device and battery monitoring module(s). This configuration greatly reduces the cost over wired battery management systems, increases the ease and efficiency of installation, simplifies maintenance and provides more versatility in the location of a computing device and/or battery pack. A wireless battery management system eliminates and/or reduces the complication of routing wires from a battery pack to a computing device. In addition, when a battery has to be changed out, a wireless battery management system eliminates the complication of marking and keeping track of wires leading from the battery pack to a computing device. Having described certain embodiments of the battery management system, it will now become apparent to one of skill in the art that other embodiments incorporating the concepts of the disclosure may be used. Therefore, the invention should not be limited to certain embodiments, but should encompass the spirit and scope of the claims.

It will be apparent to those skilled in the art that various modifications, combinations and variations can be made in the present invention without departing from the spirit or scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:

1. A battery management system comprising:
   a computing device comprising:
      an output data request port coupled with a wireless computer signal transmitter; and
      an input data port coupled with a wireless computer signal receiver;
   a first battery unit monitoring module coupled with a first battery unit and comprising:

an input data request port coupled with a module wireless signal receiver that is connected wirelessly to the wireless computer signal transmitter of the output data request port of the computing device;

an output data request port;

an output data port coupled with a wireless module signal transmitter connected wirelessly to the wireless computer signal receiver of the input data port of the computing device;

wherein computing device sends a data request to the output data request port that is converted into a wireless signal by the wireless computer signal transmitter;

wherein said data request is received by the wireless module signal receiver and provided to the input data request port;

a second battery unit monitoring module coupled with a second battery unit and comprising:

a single input data request port connected only to the output data request port of the first battery unit monitoring module, therein defining a module connection between said first battery unit monitoring module and said second battery unit monitoring module;

an output data port coupled the input data port of the computing device;

wherein the first battery unit monitoring is a master to said second battery unit monitoring module and the second battery unit monitoring module is a slave to the first battery unit monitoring module, wherein the first battery unit monitoring module responds to a data request signal from the output data request port of the computing device b transmitting data of the first battery unit to the input data port of the computing device and subsequently transmits a data request to the second battery unit monitoring module through said module connection; and wherein the second battery unit monitoring module responds to the data request from the output data request port the first battery unit monitoring module by transmitting data of the second battery unit to the input data port of the computing device;

wherein the computing device receives data from the first and second battery unit monitoring modules sequentially after sending a single data request signal to only the first battery unit monitoring module; and wherein the computing device receives data from the second battery unit monitoring module automatically after receiving data from the first battery unit monitoring module.

2. The battery management system of claim 1, wherein the second battery unit monitoring module comprises a second wireless module signal transmitter and whereby the second battery unit monitoring module wirelessly transmits data of the second battery unit to the wireless computer signal receiver.

3. The battery management system of claim 1, wherein the second battery unit monitoring module transmits data of the second battery unit to the first battery unit monitoring module through the module connection for wireless transmission to the wireless computer signal receiver by the wireless module signal transmitter of the first battery unit monitoring module.

4. The battery management system of claim 1, wherein the first battery unit monitoring module connects to a first battery unit for an electric vehicle.

5. The battery management system of claim 1, wherein the first battery unit monitoring module comprises an analog-to-digital converter that measures a voltage of the first battery unit.

6. The battery management system of claim 1, wherein the first battery unit monitoring module comprises a temperature monitoring device that measures a temperature of the first battery unit.

7. The battery management system of claim 1, wherein the data of the first battery unit is a voltage and a temperature or the first battery unit.

8. The battery management system of claim 1, wherein the computing device transmits a second data request to the first battery unit monitoring module after the computing device has not received data on the input data port for a predetermined period of time.

9. The battery management system of claim 1, wherein the computing device is configured to output an alarm when an error condition is detected.

10. The battery management system of claim 9, wherein the error condition is a high voltage condition, a low voltage condition, a high current condition, a high temperature condition or a connection fault condition.

11. The battery management system of claim 1, wherein the computing device is configured to shut off a battery charge when the computing device detects a high voltage condition across the first and second battery units.

12. The battery management system of claim 1, wherein the computing device is configured to shut off a load when the computing device detects a low voltage condition across the first and second battery units.

13. The battery management system of claim 1, further comprising a battery unit balancing system that is configured to balance the first battery unit.

14. A battery management system comprising:

as computing device comprising:

an output data request port coupled with a wireless computer signal transmitter; and an input data port coupled with a wireless computer signal receiver;

a first battery unit monitoring module coupled with a first battery unit and composing:

an input data request port coupled with a first module wireless signal receiver that is connected wirelessly to the wireless computer signal transmitter of the output data request port of the computing device;

an output data port coupled with a first wireless module signal transmitter connected wirelessly to the wireless computer signal receiver of the input data port of the computing device;

wherein computing device sends a data request to the output data request port that is convened into a wireless signal by the wireless computer signal transmitter;

wherein said data request is received by the first wireless module signal receiver and provided to the input data request port;

wherein the first battery unit monitoring module responds to a data request signal from the output data request port of the computing device by transmitting data of the first battery unit wirelessly through the first wireless module signal transmitter to the input data port of the computing device;

a second battery unit monitoring module coupled with a second battery unit and comprising:

a second input data request port coupled with a second module wireless signal receiver that is connected wirelessly to the wireless computer signal transmitter of the output data request port of the computing device;

a second output data port coupled with a second wireless module signal transmitter connected wirelessly to the wireless computer signal receiver of the input data port of the computing device;

wherein computing device sends a data request to the output data request port that is converted into a wireless signal by the wireless computer signal transmitter;

wherein said data request is received by the second wireless module signal receiver and provided to the second input data request port;

wherein the second battery unit monitoring module responds to a data request signal from the output data request port of the computing device by transmitting data of the second battery unit wirelessly through the second wireless module signal transmitter to the input data port of the computing device.

15. The battery management system of claim 14, wherein the data of the first battery unit is a voltage and a temperature of the first battery unit.

16. A method of managing a battery unit comprising the steps of:

providing a battery management system comprising:
  an output data request port coupled with a wireless computer signal transmitter; and
  an input data port coupled with a wireless computer signal receiver;

a first battery unit monitoring module coupled with a first battery unit and comprising:
  an input data request port coupled with a first module wireless signal receiver that as connected wirelessly to the wireless computer signal transmitter of the output data request port of the computing device;
  an output data port coupled with a first wireless module signal transmitter connected wirelessly to the wireless computer signal receiver of the input data port of the computing device;

wherein computing device sends a data request to the output data request port that is converted into a wireless signal by the wireless computer signal transmitter;

wherein said data request is received by the first wireless module signal receiver and provided to the input data request port;

wherein the first battery unit monitoring module responds to a data request signal from the output data request port of the computing device by transmitting data of the first battery unit wirelessly through the first wireless module signal transmitter to the input data port of the computing device;

a second battery unit monitoring module coupled with a second battery unit and comprising:
  a second input data request port coupled with a second module wireless signal receiver that is connected wirelessly to the wireless computer signal transmitter of the output data request port of the computing device;
  a second output data port coupled with a second wireless module signal transmitter connected wirelessly to the wireless computer signal receiver of the input data port of the computing device;

wherein computing device sends a data request to the output data request port that is converted into a wireless signal by the wireless computer signal transmitter;

wherein said data request is received by the second wireless module signal receiver and provided to the second input data request port;

wherein the second battery unit monitoring module responds to a data request signal from the output data request port of the computing device by transmitting data of the second battery unit wirelessly through the second wireless module signal transmitter to the input data port of the computing device; and wherein the computing device outputs an alarm when an error condition is detected.

17. The method of managing a battery unit of claim 16, wherein the error condition is a high voltage condition or a low voltage condition.

18. The method of managing a battery unit of claim 16, further comprising the step of the terminating a battery charge to a battery when the computing device detects a high voltage condition across the first and second battery units.

19. The method of managing a battery unit of claim 16, further comprising the step of the terminating a connection between a battery and a load when the computing device is detects a low voltage condition.

* * * * *